(12) United States Patent
Hwang et al.

(10) Patent No.: US 9,853,045 B2
(45) Date of Patent: Dec. 26, 2017

(54) SEMICONDUCTOR DEVICE HAVING CHANNEL HOLES

(71) Applicant: SAMSUNG ELECTRONICS CO., LTD., Suwon-si, Gyeonggi-Do (KR)

(72) Inventors: Sung Min Hwang, Seoul (KR); Jang Gn Yun, Hwaseong-si (KR); Ahn Sik Moon, Hwaseong-si (KR); Se Jun Park, Hwaseong-si (KR); Zhiliang Xia, Hwaseong-si (KR); Joon Sung Lim, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/173,888

(22) Filed: Jun. 6, 2016

(65) Prior Publication Data

US 2017/0047342 A1    Feb. 16, 2017

(30) Foreign Application Priority Data

Aug. 10, 2015  (KR) .................. 10-2015-0112377

(51) Int. Cl.
*H01L 27/11582* (2017.01)
*H01L 27/1157* (2017.01)
*H01L 27/11565* (2017.01)
*H01L 27/11573* (2017.01)

(52) U.S. Cl.
CPC .... *H01L 27/11582* (2013.01); *H01L 27/1157* (2013.01); *H01L 27/11565* (2013.01); *H01L 27/11573* (2013.01)

(58) Field of Classification Search
CPC .......... H01L 27/11582; H01L 27/1157; H01L 23/5226; H01L 23/5283
See application file for complete search history.

(56) References Cited

U.S. PATENT DOCUMENTS

| | | | |
|---|---|---|---|
| 8,236,117 B2* | 8/2012 | Serdarevic | B29D 30/16 156/123 |
| 8,288,816 B2 | 10/2012 | Komori et al. | |
| 8,349,689 B2* | 1/2013 | Lee | H01L 27/11578 257/E21.41 |
| 8,541,831 B2* | 9/2013 | Chae | H01L 27/11578 257/315 |
| 8,653,585 B2* | 2/2014 | Youm | H01L 29/7926 257/314 |
| 8,766,352 B2 | 7/2014 | Jung | |
| 8,853,767 B2 | 10/2014 | Lee et al. | |

(Continued)

FOREIGN PATENT DOCUMENTS

KR    10-2013-0136249    12/2013

*Primary Examiner* — William Coleman
(74) *Attorney, Agent, or Firm* — F. Chau & Associates, LLC

(57) ABSTRACT

A semiconductor device includes a gate stack including gate electrodes stacked vertically on a substrate. Channel holes penetrate through the gate stack to extend vertically to the substrate. Each of the channel holes includes a channel region. First channel pads are each disposed at an end of a respective channel hole opposite the substrate. Each of the first channel pads includes at least one first conductivity-type impurity. Second channel pads are each disposed at an end of a respective channel hole opposite the substrate. Each of the second channel pads includes at least one second conductivity-type impurity.

9 Claims, 33 Drawing Sheets

(56) References Cited

U.S. PATENT DOCUMENTS

| | | | |
|---|---|---|---|
| 8,987,089 B1 | 3/2015 | Pachamuthu et al. | |
| 9,099,527 B2* | 8/2015 | Yoo | H01L 29/7926 |
| 9,209,291 B2* | 12/2015 | Bin | H01L 29/78 |
| 9,245,901 B1* | 1/2016 | Liu | H01L 21/31116 |
| 9,245,962 B1* | 1/2016 | Yang | H01L 29/42344 |
| 9,431,420 B2* | 8/2016 | Hwang | H01L 27/11565 |
| 9,520,408 B2* | 12/2016 | Kim | H01L 27/11582 |
| 2013/0320424 A1 | 12/2013 | Lee et al. | |
| 2014/0346682 A1 | 11/2014 | Lee et al. | |
| 2014/0367765 A1 | 12/2014 | Lee et al. | |
| 2015/0091096 A1 | 4/2015 | Shin | |
| 2015/0091135 A1 | 4/2015 | Oh et al. | |
| 2015/0099338 A1 | 4/2015 | Yoo | |
| 2015/0146487 A1* | 5/2015 | Jung | G11C 16/14 365/185.11 |
| 2016/0013202 A1* | 1/2016 | Hwang | H01L 27/11565 257/314 |
| 2016/0079365 A1* | 3/2016 | Noda | H01L 27/11582 257/326 |
| 2016/0099250 A1* | 4/2016 | Rabkin | H01L 27/11582 257/66 |
| 2016/0148948 A1* | 5/2016 | Kim | H01L 27/11582 257/324 |
| 2016/0225754 A1* | 8/2016 | Jang | H01L 27/11582 |
| 2016/0260736 A1* | 9/2016 | Fujii | H01L 27/11582 |

* cited by examiner

SEMICONDUCTOR DEVICE HAVING CHANNEL HOLES

CROSS-REFERENCE TO RELATED APPLICATION

This application claims priority under 35 U.S.C. §119 to Korean Patent Application No. 10-2015-0112377, filed on Aug. 10, 2015, in the Korean Intellectual Property Office, the disclosure of which is incorporated by reference herein in its entirety.

TECHNICAL FIELD

Exemplary embodiments of the present inventive concept relate to a semiconductor device, and more particularly to a semiconductor device having channel holes.

DISCUSSION OF RELATED ART

Semiconductor devices may be used to process relatively large amounts of data using a relatively small number of semiconductor devices. It may be desirable to increase a degree of integration of semiconductor elements included in semiconductor devices. Thus, as one method of increasing a degree of integration of semiconductor elements, a semiconductor device having a vertical transistor structure has been proposed.

SUMMARY

An exemplary embodiment of the present inventive concept may provide a semiconductor device having an increased degree of integration.

According to an exemplary embodiment of the present inventive concept, a semiconductor device includes a gate stack including gate electrodes stacked vertically on a substrate. Channel holes penetrate through the gate stack to extend vertically to the substrate. Each of the channel holes includes a channel region. First channel pads are each disposed at an end of a respective channel hole opposite the substrate. Each of the first channel pads includes at least one first conductivity-type impurity. Second channel pads are each disposed at an end of a respective channel hole opposite the substrate. Each of the second channel pads includes at least one second conductivity-type impurity.

The semiconductor device may include a first interconnection line connected to at least a portion of the first channel pads, and a second interconnection line connected to the second channel pads. The second interconnection line may receive an electrical signal different from an electrical signal applied to the first interconnection line.

The first and second interconnection lines may be disposed at different heights.

The first channel pads among the first channel pads which are not connected to the first interconnection line may be connected to the second interconnection line.

The semiconductor device may include a third interconnection line connected to first channel pads among the first channel pads which are not connected to the first interconnection line.

The second and third interconnection lines may be disposed at substantially identical heights.

The semiconductor device may include a hole connecting portion disposed on sides of two adjacent channel holes of the channel holes to connect the two adjacent channel holes to each other.

The first and second channel pads may be disposed at upper ends of the channel holes connected by the hole connecting portion.

The hole connecting portion may extend horizontally above an upper surface of the substrate between the channel holes.

The semiconductor device may include a horizontal portion disposed below the gate stack, connecting lower portions of the channel holes to each other, and extending horizontally.

Portions of the channel region may extend from the channel holes to the horizontal portion to be connected to each other.

The horizontal portion may have a plate shape extending in a direction along the gate electrodes.

The semiconductor device may include insulation layers disposed on both sides of the gate stack, and extending in a direction along the gate stack.

According to an exemplary embodiment of the present inventive concept, a semiconductor device includes a gate stack including gate electrodes stacked vertically on a substrate. Channel holes penetrate through the gate stack to extend vertically to the substrate. A first interconnection line is connected to at least a portion of the channel holes. A second interconnection line is connected to at least a portion of the channel holes, and extends in a direction different from a direction of the first interconnection line. A third interconnection line is connected to at least a portion of the channel holes, extending in a direction different from the direction of the first interconnection line. The third interconnection line receives an electrical signal different from an electrical signal applied to the second interconnection line.

The semiconductor device may include first channel pads respectively disposed at upper ends of the channel holes connected to the first or third interconnection lines, and may include at least one first conductivity-type impurity. Second channel pads may be respectively disposed at upper ends of the channel holes connected to the second interconnection line, and may include at least one second conductivity-type impurity.

BRIEF DESCRIPTION OF DRAWINGS

The above and other features of the inventive concept will become more apparent by describing in detail exemplary embodiments thereof, with reference to the accompanying drawing, in which.

DETAILED DESCRIPTION

Figure 1:
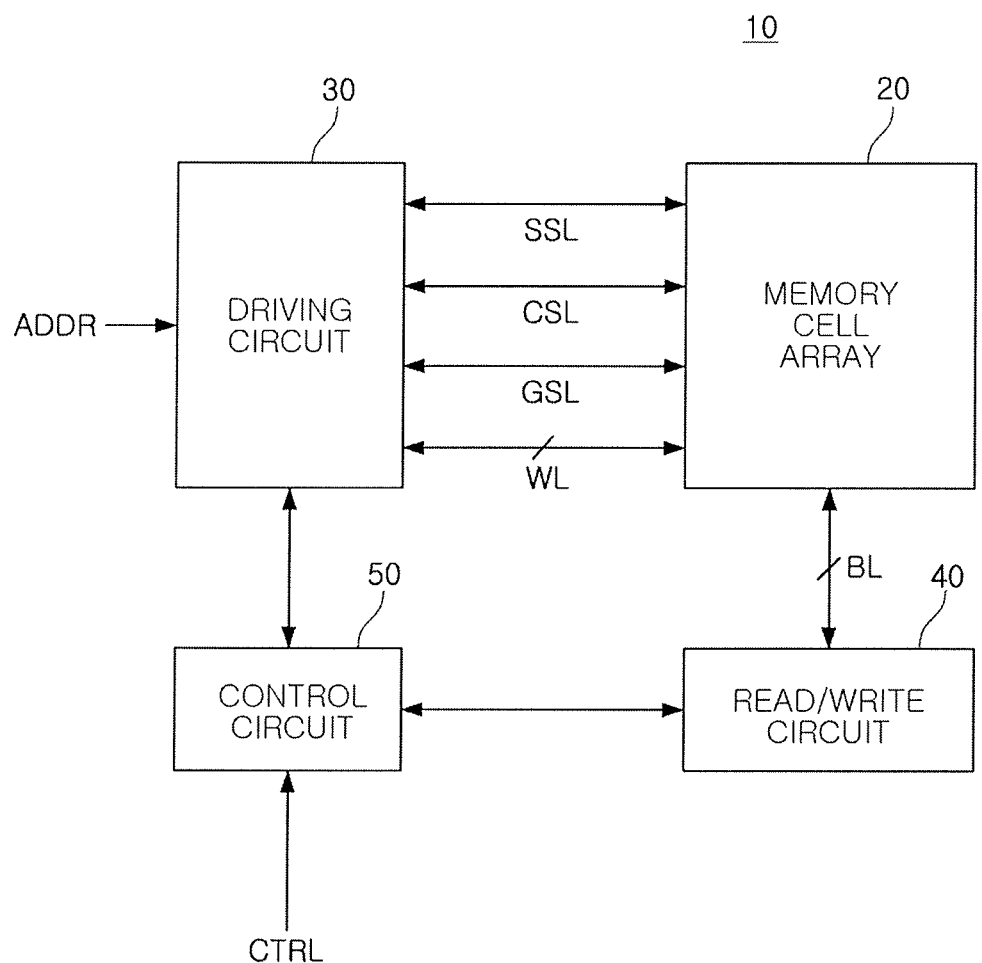
FIG. 1 is a schematic block diagram of a semiconductor device according to an exemplary embodiment of the present inventive concept.

Exemplary embodiments of the present inventive concept will be described in more detail below with reference to the accompanying drawings, in which exemplary embodiments of the present inventive concept are shown.

Exemplary embodiments of the present inventive concept may, however, be exemplified in many different forms and should not be construed as being limited to the specific embodiments set forth herein.

Throughout the specification and drawings, it will be understood that when an element, such as a layer, region or wafer (e.g., substrate), is referred to as being "on," "connected to," or "coupled to" another element, it may be directly "on," "connected to," or "coupled to" the other element or other elements intervening therebetween may be present. Like reference numerals may refer to like elements throughout the specification and drawings.

It will be apparent that though the terms first, second, and third may be used herein to describe various members, components, regions, layers and/or sections, these members, components, regions, layers and/or sections should not be limited by these terms.

Spatially relative terms, such as "above," "upper," "below," and "lower" and the like, may be used herein for clarity of description to describe one element's relationship to another element(s) as shown in the figures. It will be understood that the spatially relative terms may encompass different orientations of the device in use or operation in addition to the orientation depicted in the figures Exemplary embodiments of the present inventive concept will be described in more detail below with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing.

FIG. 1 is a schematic block diagram of a semiconductor device according to an exemplary embodiment of the present inventive concept.

Referring to FIG. 1, a semiconductor device 10 according to an exemplary embodiment of the present inventive concept may include a memory cell array 20, a driving circuit 30, a read/write circuit 40, and a control circuit 50.

The memory cell array 20 may include a plurality of memory cells, and the plurality of memory cells may be arranged in a plurality of rows and columns. The plurality of memory cells included in the memory cell array 20 may be connected to the driving circuit 30 through a word line WL, a common source line CSL, a string select line SSL, and a ground select line GSL, and may be connected to the read-write circuit 40 through a bit line BL. In some exemplary embodiments of the present inventive concept, a plurality of memory cells arranged in a single row may be connected to a single word line WL, and a plurality of memory cells arranged in a single column may be connected to a single bit line BL.

The plurality of memory cells included in the memory cell array 20 may be divided into a plurality of memory blocks. Each of the memory blocks may include a plurality of word lines WL, a plurality of string select lines SSL, a plurality of ground select lines GSL, a plurality of bit lines BL, and at least one common source line CSL.

The driving circuit 30 and the read/write circuit 40 may be controlled by the control circuit 50. According to an exemplary embodiment of the present inventive concept, the driving circuit 30 may receive address information ADDR from the outside and may decode the received address information ADDR to select at least a portion of the word line WL, the common source line CSL, the string select line SSL, and the ground select line GSL connected to the memory cell array 20. The driving circuit 30 may include a driving circuit for each of the word line WL, the string select line SSL, and the common source line CSL.

The read/write circuit 40 may select at least a portion of bit lines BL connected to the memory cell array 20 in response to a command received from the control circuit 50. The read/write circuit 40 may read data stored in a memory cell connected to the bit lines BL, or may write data in the memory cell connected to the bit line BL. The read/write circuit 40 may include circuits, such as a page buffer, an Input/Output (I/O) buffer, and a data latch, and may perform the operations described above.

The control circuit 50 may control operations of the driving circuit 30 and the read/write circuit 40 in response to a control signal CTRL transmitted from the outside. In the case of reading data stored in the memory cell array 20, the control circuit 50 may control the driving circuit 30 to supply a voltage for a data reading operation to the word line WL in which data may be stored. When the voltage for the data reading operation is supplied to a certain word line WL, the control circuit 50 may control the read/write circuit 40 to read data stored in a memory cell connected to the word line WL to which the voltage for the data reading operation is supplied.

When writing data to the memory cell array 20, the control circuit 50 may control operations of the driving circuit 30 to supply a voltage for a write operation to the word line WL in which data may be written. When the voltage for the write operation is supplied to a certain word line WL, the control circuit 50 may control the read/write circuit 40 to write data to a memory cell connected to the word line WL to which the voltage for the write operation is supplied.

Figure 2:
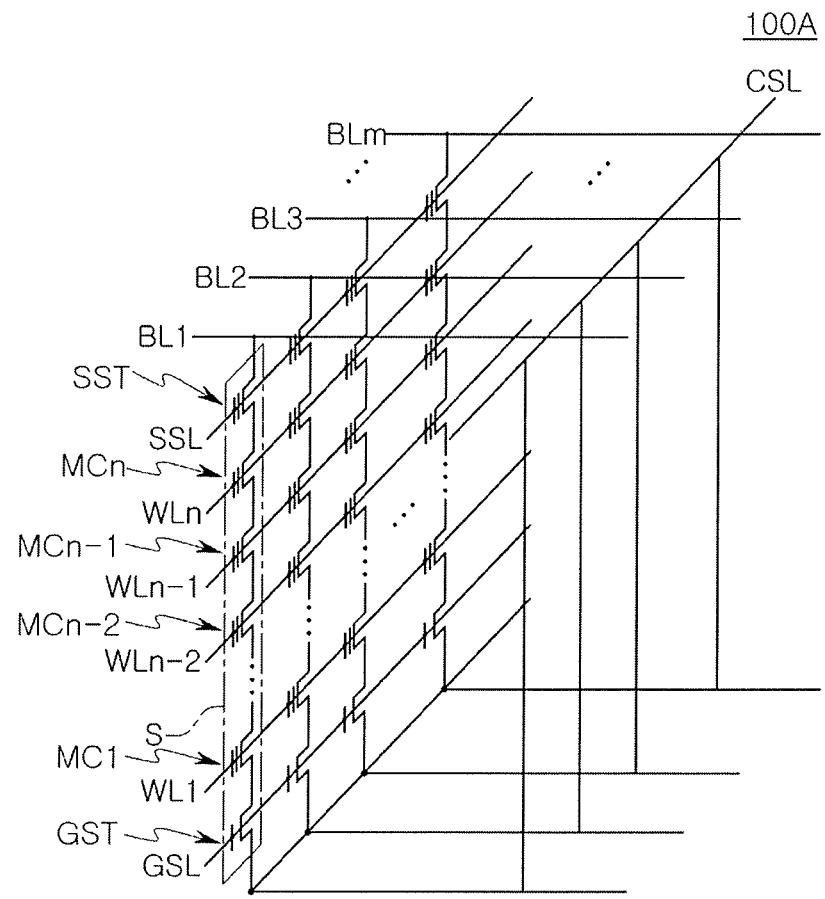
FIG. 2 is an equivalent circuit diagram of a memory cell array of a semiconductor device according to an exemplary embodiment of the present inventive concept.

FIG. 2 is an equivalent circuit diagram of a memory cell array of a semiconductor device according to an exemplary embodiment of the present inventive concept.

FIG. 2 is an equivalent circuit diagram of a three-dimensional structure of memory cell arrays included in a semiconductor device 100A having a vertical structure. Referring to FIG. 2, each of memory cell arrays according to an exemplary embodiment of the present inventive concept may include n memory cell devices MC1 to MCn connected to each other in series, and a ground select transistor GST and a string select transistor SST connected to both ends of each of the memory cell devices MC1 to MCn in series, respectively.

The n memory cell devices MC1 to MCn connected to each other in series may be connected to word lines WL1 to WLn selecting at least a portion of the memory cell devices MC1 to MCn.

A gate terminal of the ground select transistor GST may be connected to a ground select line GSL, and a source terminal of the ground select transistor GST may be connected to a common source line CSL. A gate terminal of the string select transistor SST may be connected to a string select line SSL, and a source terminal of the string select transistor SST may be connected to a drain terminal of the memory cell device MCn. FIG. 2 illustrates a structure in which a ground select transistor GST and a string select transistor SST are connected to the n memory cell devices MC1 to MCn connected to each other in series, individually. However, a plurality of ground select transistors GST or a plurality of string select transistors SST may be connected to the n memory cell devices MC1 to MCn.

A drain terminal of the string select transistor SST may be connected to bit lines BL1 to BLm. When a signal is applied to the gate terminal of the string select transistor SST through the string select line SSL, signals applied through the bit lines BL1 to BLm may be transmitted to the n memory cell devices MC1 to MCn connected to each other in series, and a data reading operation or a data writing operation may be performed.

Figure 3:
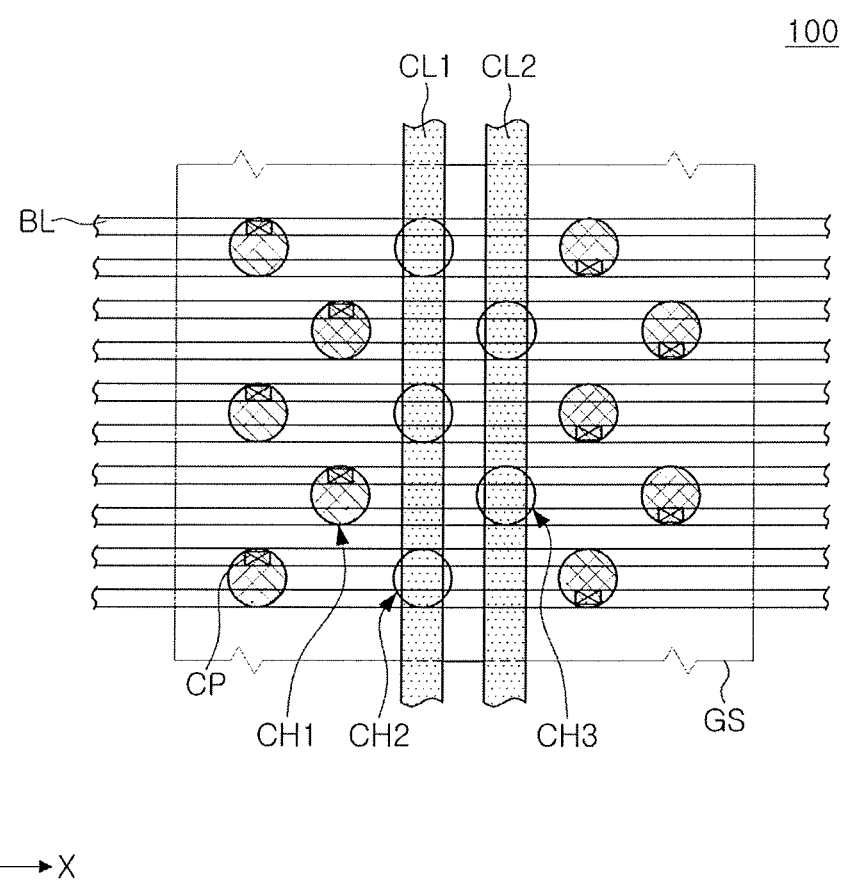
FIG. 3 is a schematic plan view of a semiconductor device according to an exemplary embodiment of the present inventive concept.

FIG. 3 is a schematic plan view of a semiconductor device according to an exemplary embodiment of the present inventive concept.

Referring to FIG. 3, a plan view of a schematic layout of components of a memory cell array region included in the semiconductor device 100 is illustrated. The semiconductor device 100 may include a gate stack GS, first to third channel holes CH1, CH2, and CH3 penetrating through the gate stack GS, contact plugs CP disposed on the first channel holes CH1, a first conductive line CL1 disposed on the second channel holes CH2, a second conductive line CL2 disposed on the third channel holes CH3, and bit lines BL disposed on the contact plugs CP.

The gate stack GS may include gate electrodes of the memory cell devices MC1 to MCn, the ground select transistor GST, and the string select transistor SST. The gate stack GS may include gate electrodes of transistors of a plurality of memory cell arrays stacked in a single direction. The gate stack GS may be spaced apart from an adjacent gate stack GS by a predetermined distance in an x direction. The gate stack GS may extend in a y direction, and may be connected to circuits of a peripheral circuit region in a region not illustrated.

The first to third channel holes CH1, CH2, and CH3 may penetrate through the gate stack GS, may be parallel to each other in the x direction in a single gate stack GS, and may be shifted to alternate with each other in the y direction. An arrangement of the first to third channel holes CH1, CH2, and CH3 may be changed according to an exemplary embodiment of the present inventive concept, and the number of the first to third channel holes CH1, CH2, and CH3 arranged in a single direction is not limited to that of FIG. 3.

The semiconductor device 100 may include a single memory cell string around each of the first channel holes CH1. The first channel holes CH1 may be electrically connected to the bit lines BL by the contact plugs CP on the first channel holes CH1.

The second channel holes CH2 may be connected to the first conductive line CL1. The first conductive line CL1 may be disposed on the second channel holes CH2. The first conductive line CL1 may function as the common source lines CSL, and electrical signals of the common source lines CSL may be transmitted to the first channel holes CH1 by the second channel holes CH2.

The third channel holes CH3 may be connected to the second conductive line CL2. The second conductive line CL2 may be disposed on the third channel holes CH3. An erase voltage may be applied to the second conductive line CL2 during an erase operation of the semiconductor device 100, and the erase voltage may be transmitted to the first channel holes CH1 through the third channel holes CH3.

The second channel holes CH2 and the third channel holes CH3 may function as a type of contact plug of the first conductive line CL1 and the second conductive line CL2, respectively, and may receive different electrical signals, respectively. A relative arrangement and the number of the first to third channel holes CH1, CH2, and CH3 is not limited to those illustrated in FIG. 3.

Figure 4:
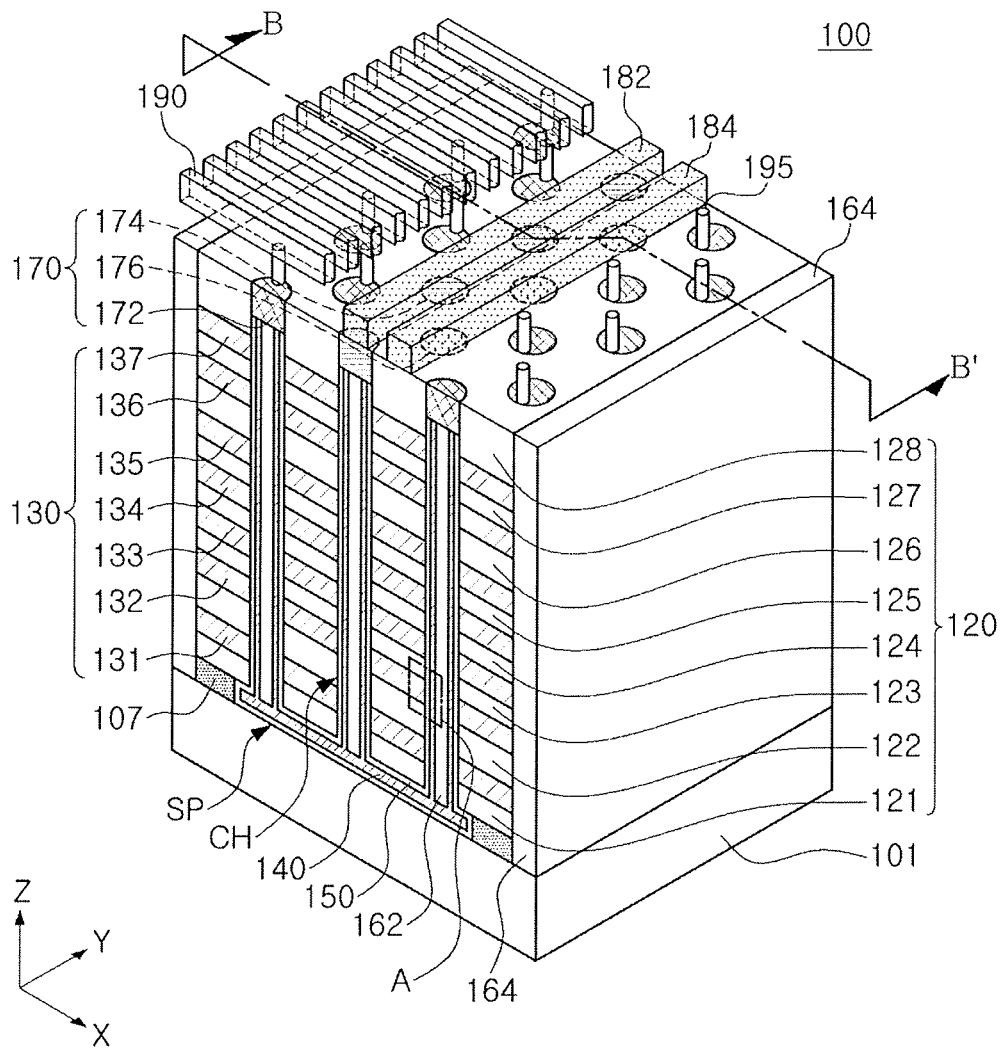
FIG. 4 is a schematic perspective view of a structure of memory cell strings of a semiconductor device according to an exemplary embodiment of the present inventive concept.
Figure 5:
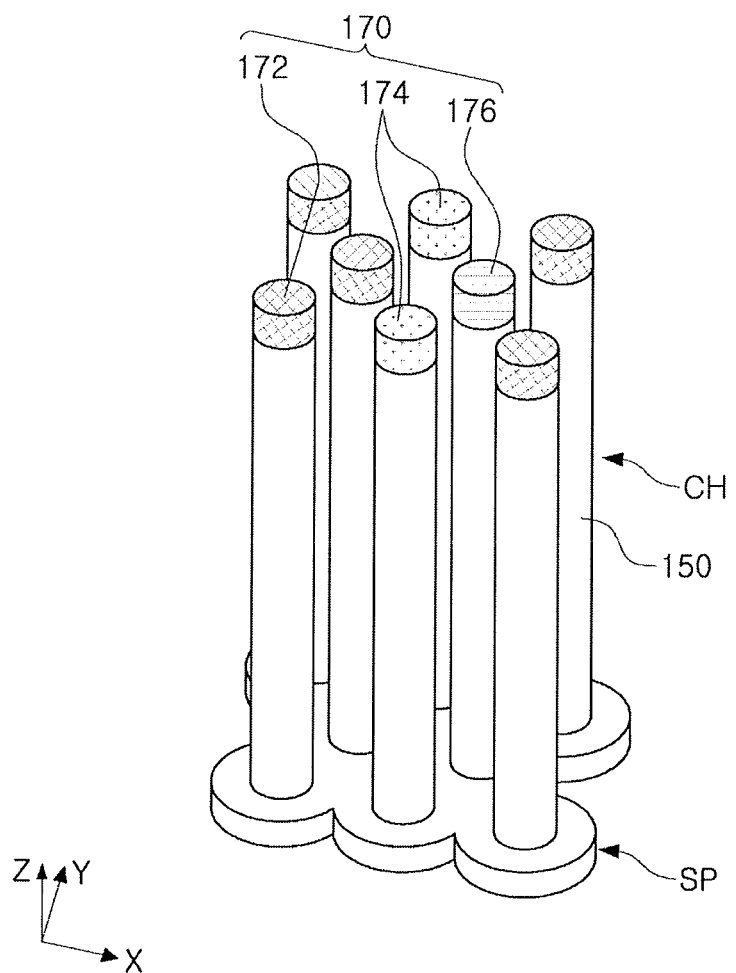
FIG. 5 is a partial perspective view of a partial configuration including channel holes illustrated in FIG. 4.

FIG. 4 is a schematic perspective view of a structure of memory cell strings of a semiconductor device according to an exemplary embodiment of the present inventive concept. FIG. 4 illustrates a region including a region illustrated on the plan view of FIG. 3, in which a portion of bit lines 190 is omitted, thus illustrating the underlying structures. FIG. 5 is a partial perspective view of a partial configuration including channel holes CH illustrated in FIG. 4.

Referring to FIGS. 4 and 5, the semiconductor device 100 may include a substrate 101, channel holes CH extending in a direction perpendicular to an upper surface of the substrate 101, and including a channel region 140 disposed in the channel holes CH, channel pads 170 disposed on an upper end of the channel holes CH, a horizontal portion SP disposed on the substrate 101 and including a region in which the channel region 140 extends horizontally, horizontal filling layers 107 outside of the horizontal portion SP, a plurality of interlayer insulation layers 120 and a plurality of gate electrodes 130 stacked adjacently to outer walls of the channel region 140. The channel pads 170 may include first to third channel pads 172, 174, and 176. The semiconductor device 100 may include a gate dielectric layer 150, a first conductive line 182, a second conductive line 184, contact plugs 195, and bit lines 190.

In the semiconductor device 100, a single memory cell string may be arranged around the channel region 140 under each of the first channel pads 172, and a plurality of memory cell strings may be arranged in rows and columns in an x direction and a y direction.

The substrate 101 may include an upper surface extending in the x and y directions. The substrate 101 may include a semiconductor material, for example, a group IV semiconductor, a group III-V compound semiconductor, or a group II-VI oxide semiconductor. For example, the group IV semiconductor may include silicon (Si), germanium (Ge), or silicon-germanium (SiGe). The substrate 101 may be a bulk wafer or an epitaxial layer.

A plurality of gate electrodes 131 to 137 collectively represented by 130 may be spaced apart from the substrate 101 in a direction perpendicular to the substrate 101 adjacent to side surfaces of each of the channel holes CH. Referring to FIGS. 2 and 3, each of the gate electrodes 130 may include gates of a ground select transistor GST, a plurality of memory cell devices MC1 to MCn, and a string select transistor SST. The gate electrodes 130 may extend while forming word lines WL1 to WLn, and may be commonly connected to each other in adjacent memory cell strings arranged by a predetermined distance in the x and y directions. In some exemplary embodiments of the present inventive concept, four gate electrodes 132 to 135 of memory cell devices MC1 to MCn may be arranged, but the number of the gate electrodes 130 is not limited thereto. The number of the gate electrodes 130 forming the memory cell devices MC1 to MCn may be determined depending on the capacity of the semiconductor device 100. For example, the number of the gate electrodes 130 forming the memory cell devices MC1 to MCn may be $2^n$, where, n is a natural number.

A gate electrode 131 of the ground select transistor GST may extend in the y direction to form the ground select line GSL. Gate electrodes 136 and 137 of the string select transistor SST may extend in the y direction to the string select line SSL. Memory cell strings under the first channel pads 172 disposed in a straight line in the x direction may be connected to different bit lines 190 by a separate wiring structure, respectively. In some exemplary embodiments of the present inventive concept, the gate electrodes 136 and 137 of the string select transistor SST may be separated from each other between the memory cell strings under the first channel pads 172 disposed in a line in the x direction to form different string select lines SSL, respectively. According to an exemplary embodiment of the present inventive concept, the gate electrodes 136 and 137 of the string select transistor SST and the gate electrode 131 of the ground select transistor GST may be provided in an amount of one, or two or more, respectively, and may have the same or a different structure from that of the gate electrodes 132 to 135 of the memory cell devices MC1 to MCn.

Some of the gate electrodes 130, for example, gate electrodes 130 adjacent to the gate electrode 131 of the ground select transistor GST or the gate electrodes 136 and 137 of the string select transistor SST, may be dummy gate electrodes. For example, the gate electrode 132 adjacent to the gate electrode 131 of the ground select transistor GST may be a dummy gate electrode.

The gate electrodes 130 may include polycrystalline silicon or a metal silicide material. The metal silicide material may be, for example, a silicide material of a metal selected from cobalt (Co), nickel (Ni), hafnium (Hf), platinum (Pt), tungsten (W), and titanium (Ti), or combinations thereof. According to an exemplary embodiment of the present inventive concept, the gate electrodes 130 may include a metal material, for example, tungsten (W). The gate electrodes 130 may include a diffusion barrier, and the diffusion barrier may include, for example, tungsten nitride (WN), tantalum nitride (TaN), titanium nitride (TiN), or combinations thereof.

A plurality of interlayer insulation layers 121 to 128 collectively represented by 120 may be disposed between the gate electrodes 130, respectively. The interlayer insulation layers 120 may also be spaced apart from each other in a direction perpendicular to the upper surface of the substrate 101 and may extend in the y direction. The interlayer insulation layers 120 may include an insulating material, such as silicon oxide or silicon nitride.

The channel holes CH may be spaced apart from each other in rows and columns on the substrate 101, and in the y direction. For example, the channel holes CH may be disposed to form a grid pattern or disposed in a zigzag pattern. The channel holes CH may have an inclined side surface narrowing towards the substrate 101 according to aspect ratios of the channel holes CH. An arrangement of the channel holes CH may be changed according to an exemplary embodiment of the present inventive concept, and is not limited to shapes illustrated in FIGS. 4 and 5.

The channel region 140 having a columnar shape may be disposed in the channel holes CH extending in the direction perpendicular to the upper surface of the substrate 101. The channel region 140 in the channel holes CH may have an annular shape surrounding first insulation layers 162 in the channel region 140, or may have a columnar shape, such as a cylinder or a prism not including the first insulation layers 162 according to an exemplary embodiment of the present inventive concept. The channel region 140 may be separated and insulated from the substrate 101 by the gate dielectric layer 150 under the channel region 140. The channel region 140 may include a semiconductor material, such as polycrystalline silicon or single crystalline silicon, and the semiconductor material may be a material not doped with an impurity, or a material including p- or n-type impurities. For example, the channel region 140 may include the same conductivity-type impurities as the third channel pad 176.

The gate dielectric layer 150 may be disposed between the gate electrodes 130 and the channel region 140 in the channel holes CH. The gate dielectric layer 150 may extend vertically from the substrate 101 adjacently to the channel region 140. The gate dielectric layer 150 may include a tunneling layer, a charge storage layer, and a blocking layer sequentially stacked from the channel region 140. The gate dielectric layer 150 will be described below in more detail with reference to FIGS. 6A through 6C.

The horizontal portion SP and the horizontal filling layers 107 may be disposed under a gate stack of the gate electrodes 130 and the interlayer insulation layers 120 on the substrate 101. The horizontal portion SP may have a structure in which the horizontal portion SP is connected to the channel holes CH and regions of the horizontal portion SP are disposed as a layer parallel to the upper surface of the substrate 101 which may be connected to each other between at least certain channel holes CH. The regions of the horizontal portion SP may be connected to each other between the channel holes CH disposed between two adjacent second insulation layers 164 in the x direction, and extend in the y direction, but exemplary embodiments of the present inventive concept are not limited thereto.

Referring to FIG. 5, the horizontal portion SP may have a circular shape surrounding each of the channel holes CH, in which the channel region 140 is disposed, under each channel hole CH, and may have a plate-shaped structure in which the regions of the horizontal portion SP are connected to each other between at least certain channel holes CH. The shape of the horizontal portion SP is not limited to that of FIG. 5, and may have the shape of a quadrangular plate in some exemplary embodiments of the present inventive concept. The horizontal filling layers 107 of side surfaces of the horizontal portion SP may be omitted.

The horizontal portion SP may include portions of the gate dielectric layer 150 and the channel region 140. For example, the horizontal portion SP may include the channel region 140 and the gate dielectric layer 150 extending horizontally from the channel holes CH. The horizontal portion SP may include the gate dielectric layer 150 disposed on a lower surface and side surfaces of the horizontal portion SP, and may be filled with the channel region 140. An arrangement of the channel region 140 and the gate dielectric layer 150 in the horizontal portion SP is not limited thereto, and may be changed according to an exemplary embodiment of the present inventive concept.

The horizontal filling layers 107 may fill spaces between the horizontal portion SP and the second insulation layers 164, and may be disposed horizontally with respect to the horizontal portion SP. For example, the horizontal filling layers 107 may forma single layer parallel to the upper surface of the substrate 101 along with the horizontal portion SP. The horizontal filling layers 107 may include a conductive material, for example, a semiconductor material, but exemplary embodiments of the present inventive concept are not limited thereto.

The channel pads 170 may be disposed on the channel region 140. The channel pads 170 may include the first to third channel pads 172, 174, and 176. The channel pads 170 may cover an upper surface of the first insulation layers 162 and may be electrically connected to the channel region 140. The channel pads 170 may include, for example, doped polycrystalline silicon. The first to third channel pads 172, 174, and 176 may have the same shape, and may include different types of impurities or may have different wiring structures disposed thereon, respectively.

The first channel pads 172 may be disposed on upper ends of the first channel holes CH1, and may include first conductivity-type impurities. The first conductivity-type impurities may include, for example, n-type impurities, and may include phosphorous (P), or arsenic (As). Channel holes CH in which the first channel pads 172 are disposed may function as memory cell strings. The first channel pads 172 may act as drain regions of string select transistors SST. The first channel pads 172 may be electrically connected to the bit lines 190 by the contact plugs 195.

The second channel pads 174 may be disposed on upper ends of the second channel holes CH2, and may include the first conductivity-type impurities. Channel holes CH in which the second channel pads 174 are disposed may function as contact plugs of common source lines CSL of memory cell strings. The second channel pads 174 may be connected to a first conductive line 182 which may function as the common source line CSL. For example, during a data reading operation of the semiconductor device 100, electrons may move from portions of the channel region 140 under the first channel pads 172 to the first conductive line 182 through the horizontal portion SP and portions of the channel region 140 under the second channel pads 174.

The third channel pads 176 may be disposed on upper ends of the third channel holes CH3, and may include second conductivity-type impurities. The second conductivity-type impurities may include, for example, p-type impurities, and may include boron (B), or aluminum (As). Channel holes CH in which the third channel pads 176 are disposed may function as a body or well contact plug which may allow an erase voltage to be applied to memory cell strings. The third channel pads 176 may be connected to the second conductive line 184 to which an electrical signal different from that applied to the first conductive line 182 is applied. For example, during an erase operation of the semiconductor device 100, holes may move from the third channel pads 176 to portions of the channel region 140 under the first channel pads 172 through the horizontal portion SP and portions of the channel region 140 under the third channel pads 176.

The first and second conductive lines 182 and 184 may extend in the y direction on the second and third channel pads 174 and 176, respectively. The first and second conductive lines 182 and 184 may be parallel to each other, but exemplary embodiments of the present inventive concept are not limited thereto. The first conductive line 182 may function as the common source line CSL, and the second conductive line 184 may function as a signal line applying an erase voltage.

In an exemplary embodiment of the present inventive concept, the first and second conductive lines 182 and 184 are illustrated as being directly connected to the second and third channel pads 174 and 176, respectively, but exemplary embodiments of the present inventive concept are not limited thereto. For example, in some exemplary embodiments of the present inventive concept, contact plugs may be disposed between the first and second conductive lines 182 and 184 and between the second and third channel pads 174 and 176, respectively.

The first and second conductive lines 182 and 184 may include a conductive material, for example, a metal, such as tungsten (W), aluminum (Al), or copper (Cu).

The contact plugs 195 may be disposed on the first channel pads 172. The contact plugs 195 may electrically connect the first channel pads 172 to the bit lines 190 on the contact plugs 195. In some exemplary embodiments of the present inventive concept, the contact plugs 195 may have a shape of which the width narrows along a downward direction.

The bit lines 190 may extend in a direction different from those of the first and second conductive lines 182 and 184 on the contact plugs 195, for example, the x direction. The bit lines 190 may be arranged at a height different from a height of the first and second conductive lines 182 and 184. Thus, the bit lines 190 might not contact the first and second conductive lines 182 and 184. In some exemplary embodiments of the present inventive concept, the bit lines 190 may include additional interconnection lines and contact plugs arranged under or on the bit lines 190.

The contact plugs 195 and the bit lines 190 may include a conductive material, for example, a metal, such as tungsten (W), aluminum (Al), or copper (Cu).

Figure 6A:
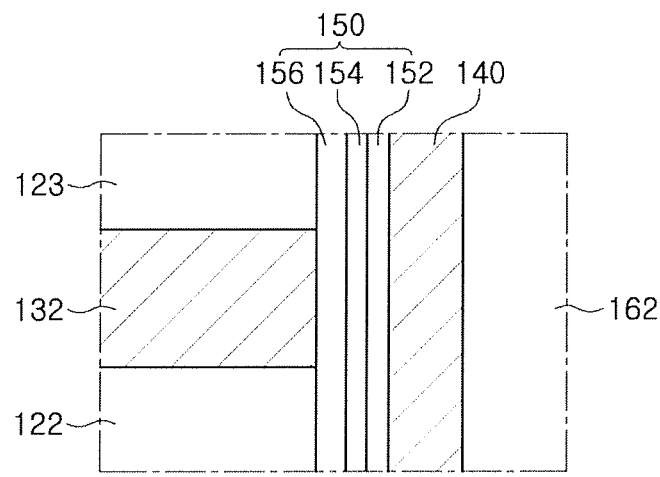
FIGS. 6A through 6C illustrate a region corresponding to Region A of FIG. 4 as cross-sectional views of a gate dielectric layer according to an exemplary embodiment of the present inventive concept.
Figure 6B:
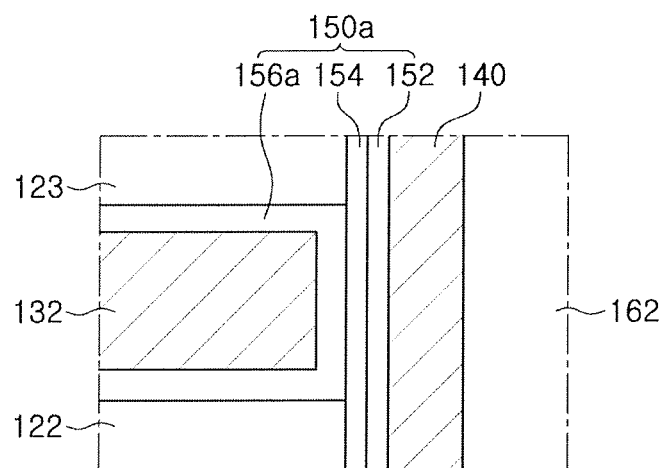
Figure 6C:
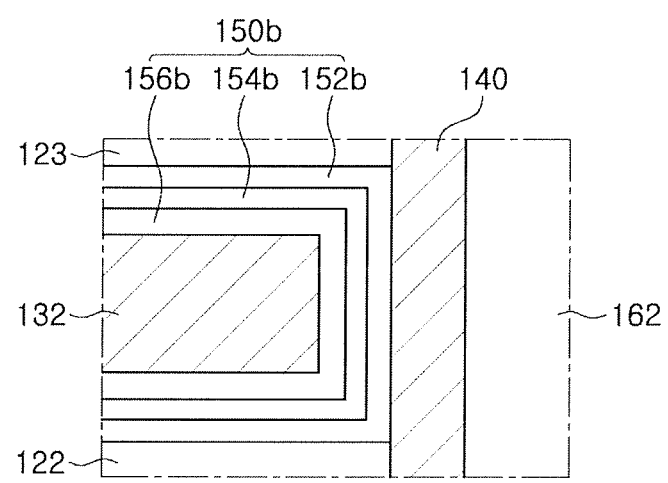

FIGS. 6A through 6C illustrate a region corresponding to Region A of FIG. 4 as cross-sectional views respectively illustrating a gate dielectric layer according to an exemplary embodiment of the present inventive concept.

Referring to FIG. 6A, the gate electrode 132, the gate dielectric layer 150, and the channel region 140 of memory cell strings are illustrated. The gate dielectric layer 150 may include a tunneling layer 152, a charge storage layer 154, and a blocking layer 156 sequentially stacked from the channel region 140.

The tunneling layer 152 transmit electric charges to the charge storage layer 154 in an F-N tunneling. The tunneling layer 152 may include, for example, silicon dioxide (SiO$_2$), silicon nitride (Si$_3$N$_4$), silicon oxynitride (SiON) or combinations thereof.

The charge storage layer 154 may be a charge trap layer or a conductive floating gate layer. For example, the charge storage layer 154 may include a dielectric material, quantum dots, or nanocrystals. The quantum dots or the nanocrystals may include an electric conductor, for example, nanoparticles of a metal or a semiconductor. In some exemplary embodiments of the present inventive concept, when the charge storage layer 154 is a charge trap layer, the charge storage layer 154 may include silicon nitride.

The blocking layer 156 may include silicon dioxide (SiO$_2$), silicon nitride (Si$_3$N$_4$), silicon oxynitride (SiON), a high-k dielectric material or combinations thereof. The high-k dielectric material may be one of aluminum oxide (Al$_2$O$_3$), tantalum oxide (Ta$_2$O$_3$), titanium oxide (TiO$_2$), yttrium oxide (Y$_2$O$_3$), zirconium oxide (ZrO$_2$), zirconium silicon oxide (ZrSi$_x$O$_y$), hafnium oxide (HfO$_2$), hafnium silicon oxide (HfSi$_x$O$_y$), lanthanum oxide (La$_2$O$_3$), lanthanum aluminum oxide (LaAl$_x$O$_y$), lanthanum hafnium oxide (LaHf$_x$O$_y$), hafnium aluminum oxide (HfAl$_x$O$_y$), and praseodymium oxide (Pr$_2$O$_3$).

Referring to FIG. 6B, the gate electrode 132, a gate dielectric layer 150a, and the channel region 140 of memory cell strings are illustrated. The gate dielectric layer 150a may have a structure in which the tunneling layer 152, the charge storage layer 154, and a blocking layer 156a are sequentially stacked from the channel region 140. A relative thickness of the layers included in the gate dielectric layer 150a is not limited to the layers illustrated in FIG. 6B.

The gate dielectric layer 150a according to an exemplary embodiment of the present inventive concept may include the tunneling layer 152 and the charge storage layer 154 extending vertically adjacent to the channel region 140, and the blocking layer 156a surrounding the gate electrode layer 132. In some exemplary embodiments of the present inventive concept, a portion of the blocking layer 156a may extend vertically adjacent to the channel region 140, and portions of the blocking layer 156a may surround the gate electrode 132.

Referring to FIG. 6C, the gate electrode 132, a gate dielectric layer 150b, and the channel region 140 of memory cell strings are illustrated. The gate dielectric layer 150b may have a structure in which a tunneling layer 152b, a charge storage layer 154b, and a blocking layer 156b are sequentially stacked from the channel region 140.

The gate dielectric layer 150b according to an exemplary embodiment of the present inventive concept may include the tunneling layer 152b, the charge storage layer 154b, and the blocking layer 156b surrounding the gate electrode 132.

Figure 7A:
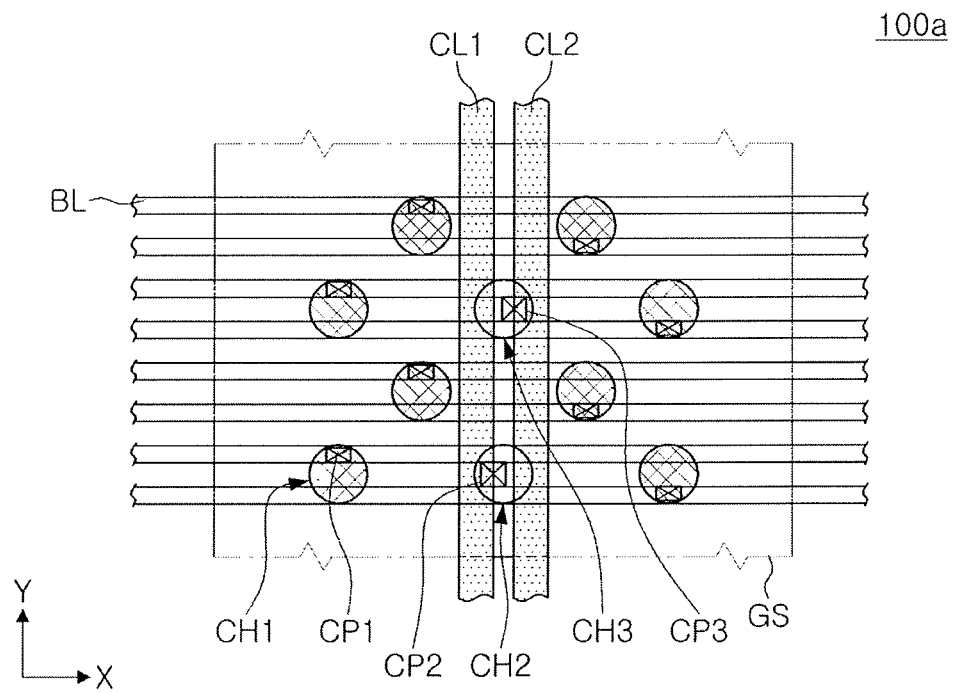
FIGS. 7A and 7B are schematic plan views of semiconductor devices according to an exemplary embodiment of the present inventive concept.
Figure 7B:
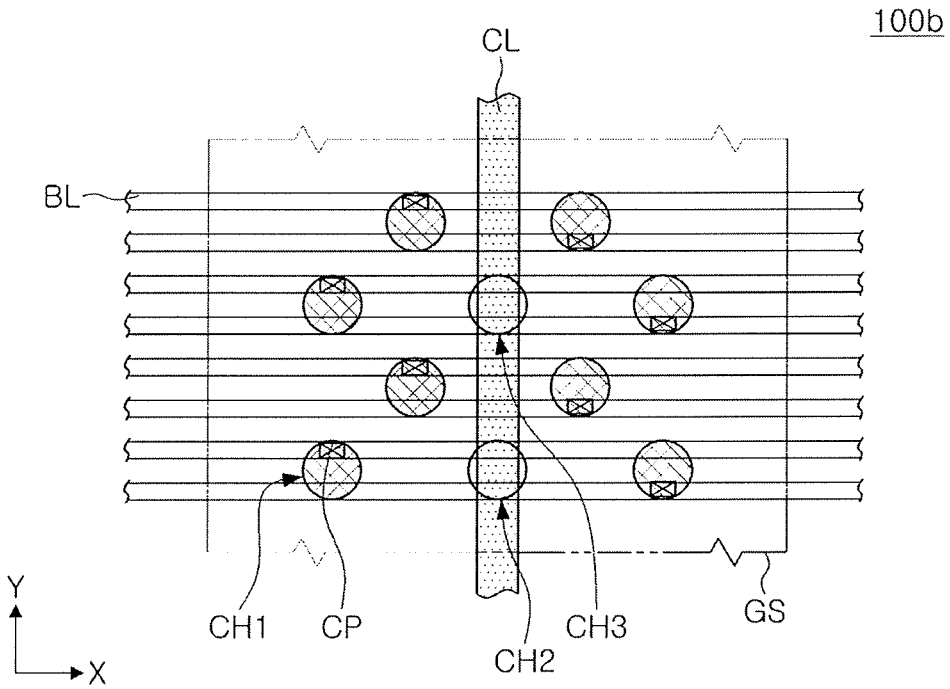

FIGS. 7A and 7B are schematic plan views of semiconductor devices according to an exemplary embodiment of the present inventive concept.

Referring to FIG. 7A, a semiconductor device 100a may include the gate stack GS, first to third channel holes CH1, CH2, and CH3 penetrating through the gate stack GS, first to third contact plugs CP1, CP2, and CP3 disposed on the first to third channel holes CH1, CH2, and CH3, respectively, bit lines BL disposed on the first contact plugs CP1, a first conductive line CL1 disposed on the second contact plugs CP2, and a second conductive line CL2 disposed on the third contact plugs CP3.

The semiconductor device 100a according to an exemplary embodiment of the present inventive concept may have the second and third contact plugs CP2 and CP3 disposed on the second and third channel holes CH2 and CH3, respectively, and the second and third channel holes CH2 and CH3 may be connected to the first and second conductive lines CL1 and CL2 through the second and third contact plugs CP2 and CP3, respectively. The first and second conductive lines CL1 and CL2 may be disposed at a height different from that of bit lines BL and might not contact the bit lines BL. Thus, the height of the first contact plugs CP1 may be different from that of the second and third contact plugs CP2 and CP3. For example, the first and second conductive lines CL1 and CL2 may be disposed at a lower height than that of bit lines BL.

When the second channel holes CH2 and the third channel holes CH3 are disposed in a line in a y direction, use of the second and third contact plugs CP2 and CP3 may allow the second and third channel holes CH2 and CH3 to be connected to the first and second conductive lines CL1 and CL2, respectively, which may be interconnection lines. The second and third contact plugs CP2 and CP3 may be off-center in opposite directions on the second and third channel holes CH2 and CH3, respectively.

Sizes and relative arrangements of the second and third contact plugs CP2 and CP3 and the first and second conductive lines CL1 and CL2 are not limited to those illustrated in FIG. 7A, and may be changed in a range in which the second and third contact plugs CP2 and CP3 and the first and second conductive lines CL1 and CL2 are electrically connected to each other without being electrically disconnected.

Referring to FIG. 7B, a semiconductor device 100b may include the gate stack GS, first to third channel holes CH1, CH2, and CH3 penetrating through the gate stack GS, contact plugs CP disposed on the first channel holes CH1, the conductive line CL disposed on the second and third channel holes CH2 and CH3, and bit lines BL disposed on the contact plugs CP.

The semiconductor device 100b according to an exemplary embodiment of the present inventive concept may allow the second and third channel holes CH2 and CH3 to be connected to a single conductive line CL. Thus, the conductive line CL may allow a ground voltage to be applied during a programming or data reading operation, and an erase voltage to be applied during an erase operation. The second and third channel pads 174 and 176 positioned at the upper ends of the second and third channel holes CH2 and CH3, respectively, may include different impurities, respectively, but exemplary embodiments of the present inventive concept are not limited thereto. For example, the second and third channel pads 174 and 176 may have the same conductivity type.

Figure 8A:
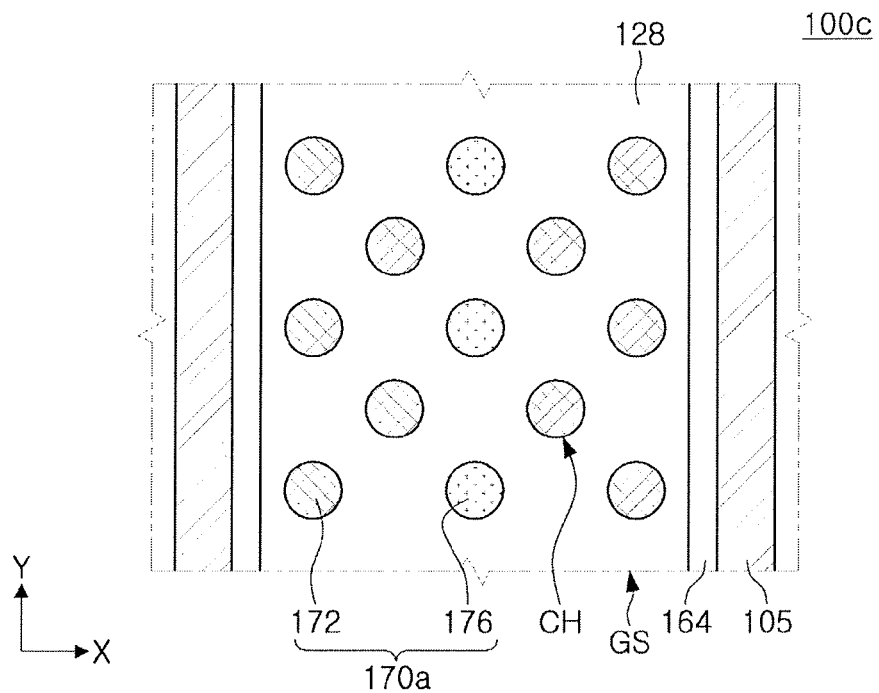
FIGS. 8A through 8C are schematic plan views of semiconductor devices according to an exemplary embodiment of the present inventive concept.
Figure 8B:
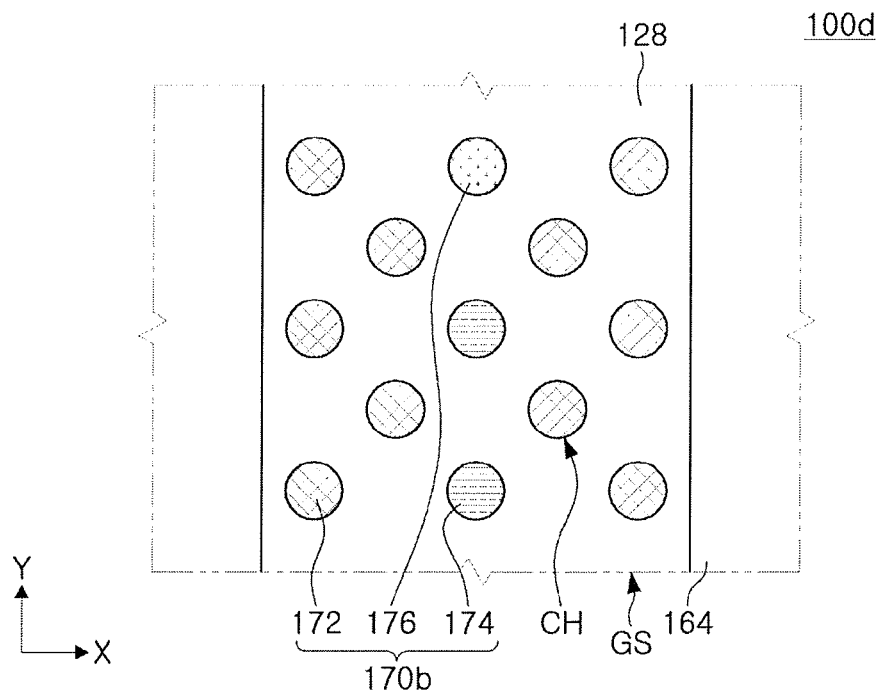
Figure 8C:
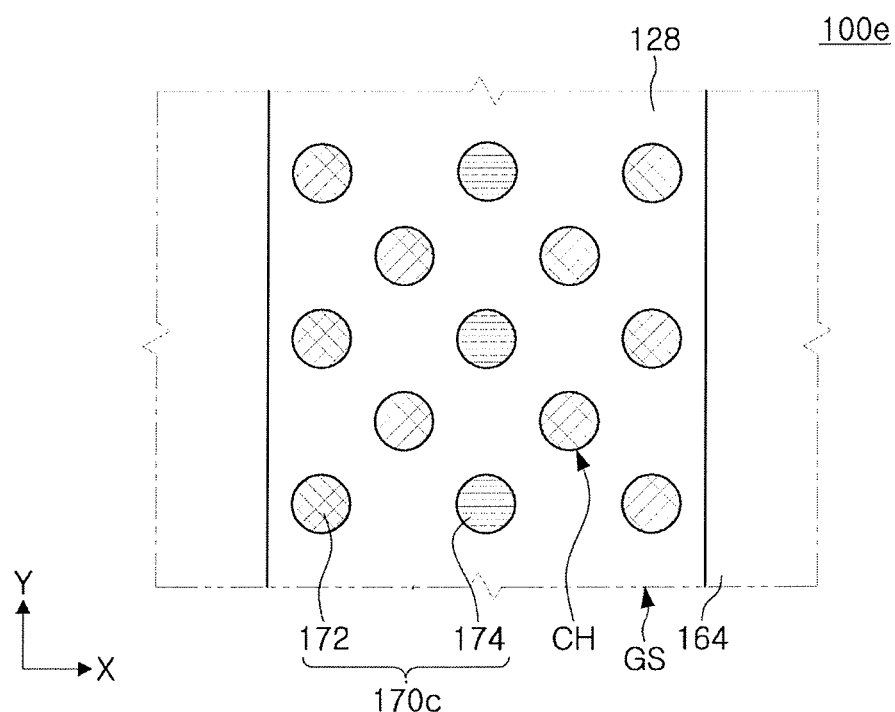

FIGS. 8A through 8C are schematic plan views of semiconductor devices according to an exemplary embodiment of the present inventive concept. FIGS. 8A through 8C are illustrated without the components which may be disposed on the channel pads 170, such as the first and second conductive lines 182 and 184, the contact plugs 195, and the bit lines 190.

Referring to FIG. 8A, channel pads 170a disposed at upper ends of channel holes CH of a semiconductor device 100c, and conductive layers 105 penetrating through second insulation layers 164, are illustrated.

According to an exemplary embodiment of the present inventive concept, the channel pads 170a may include first channel pads 172 disposed at upper ends of the channel holes CH forming a memory cell string, and third channel pads 176 on which the second conductive line 184 receiving an erase voltage is disposed. Thus, the second channel pads 174 connected to the common source line CSL need not be disposed at upper ends of the channel holes CH. The conductive layers 105 forming the common source line CSL may extend in a y direction on at least one end of a gate stack GS. The conductive layers 105 may have one end connected to the substrate 101.

Referring to FIG. 8B, channel pads 170*b* disposed on channel holes CH of a semiconductor device 100*d* are illustrated.

According to an exemplary embodiment of the present inventive concept, the channel pads 170*b* may include first channel pads 172 disposed at upper ends of channel holes CH forming a memory cell string, second channel pads 174 on which the first conductive line 182 corresponding to the common source line CSL are disposed, and third channel pads 176 on which the second conductive line 184 receiving an erase voltage are disposed.

The second and third channel pads 174 and 176 need not be disposed in separate rows, and may be disposed in a single row. The second and third channel pads 174 and 176 might not be alternately disposed in a y direction, and a plurality of second channel pads 174 may be disposed and then the third channel pads 176 may be disposed. For example, a relatively small number of third channel pads 176 may be disposed. Thus, arrangements, repeating patterns, and numbers of the second and third channel pads 174 and 176 may be changed according to an exemplary embodiment of the present inventive concept.

In some exemplary embodiments of the present inventive concept, the third channel pads 176 may have the same conductivity type as the first and second channel pads 172 and 174. For example, the first channel pads 172, the second channel pads 174 and the third channel pads 176 may have N-type conductivity.

In some exemplary embodiments of the present inventive concept, the first channel pads 172, the second channel pads 174 and the third channel pads 176 may have the same impurity concentration.

Referring to FIG. 8C, channel pads 170*c* disposed at upper ends of channel holes CH of a semiconductor device 100*e* are illustrated.

According to an exemplary embodiment of the present inventive concept, the channel pads 170*c* may include first channel pads 172 disposed at upper ends of the channel holes CH forming a memory cell string, and second channel pads 174 on which the first conductive line 182 corresponding to the common source line CSL is disposed.

In some exemplary embodiments of the present inventive concept, the channel pads 170*c* may have the same conductivity type. For example, the channel pads 170*c* may have N-type conductivity.

In some exemplary embodiments of the present inventive concept, the channel pads 170*c* may have the same impurity concentration.

In some exemplary embodiments of the present inventive concept, the channel pads 170*c* need not include the third channel pads 176. Thus, the second conductive line 184 may be omitted, and the channel pads 170*c* may only include the first and second channel pads 172 and 714 including the first conductivity-type impurities. In this case, an erase operation of the semiconductor device 100*e* may be performed by controlling a voltage applied to gate electrodes 130, but exemplary embodiments of the present inventive concept are not limited thereto.

Figure 9A:
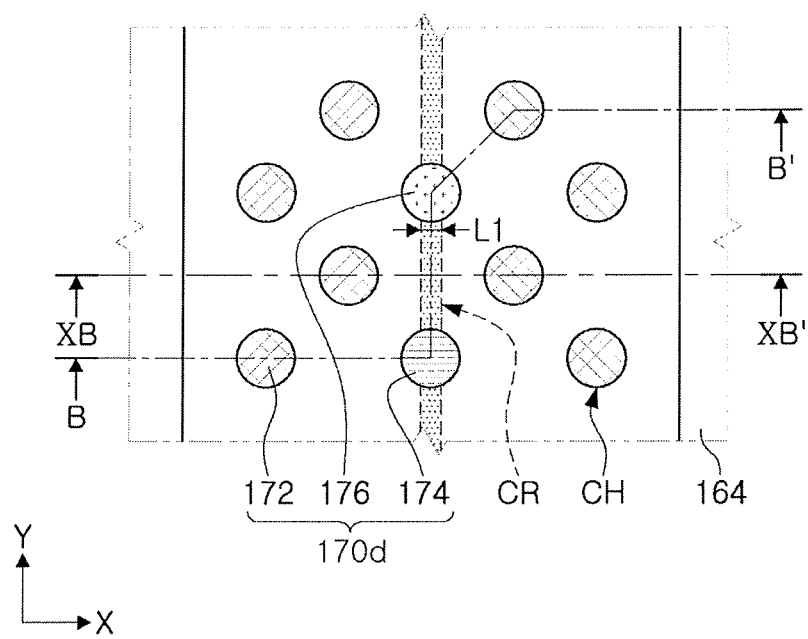
FIG. 9A is a schematic plan view of a semiconductor device according to an exemplary embodiment of the present inventive concept.

FIG. 9A is a schematic plan view of a semiconductor device according to an exemplary embodiment of the present inventive concept. FIGS. 9B through 10B are schematic cross-sectional views of semiconductor devices according to an exemplary embodiment of the present inventive concept.

Figure 9B:
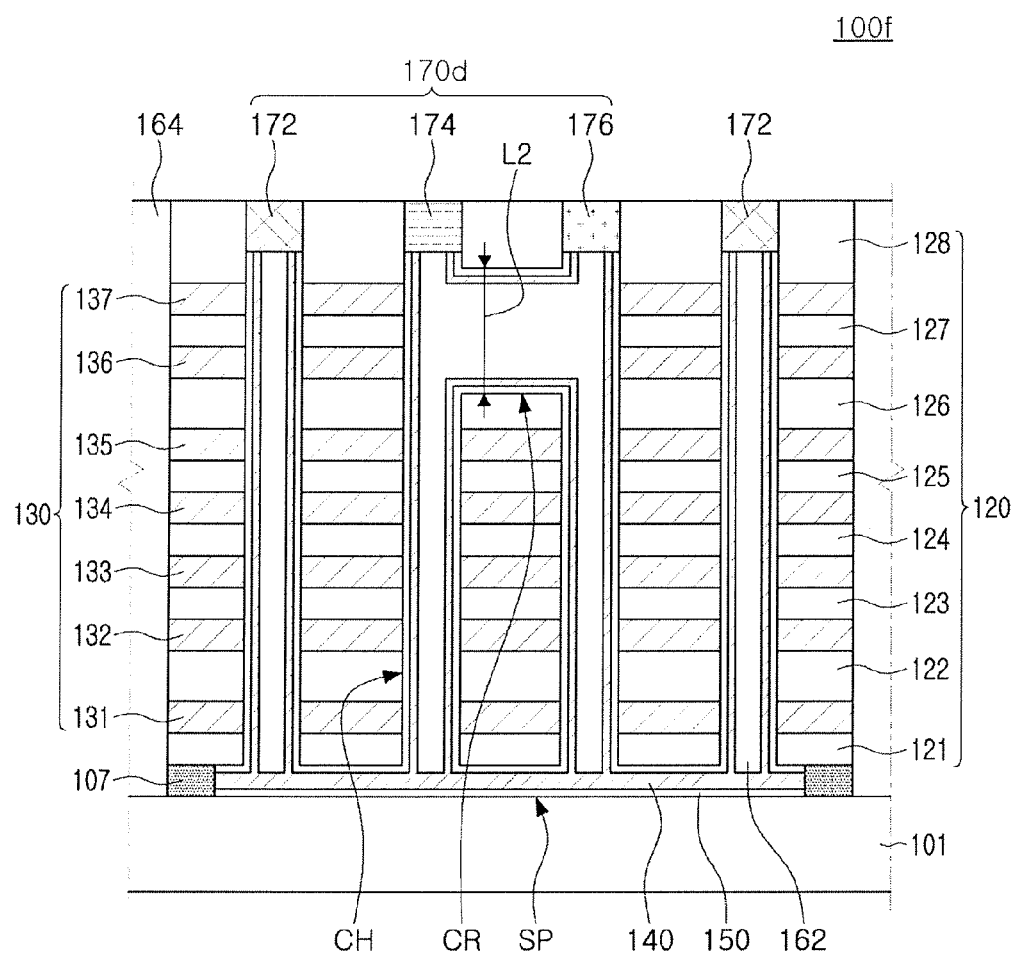
FIGS. 9B, 10A and 10B are schematic cross-sectional views of semiconductor devices according to an exemplary embodiment of the present inventive concept.

FIG. 9B is a cross-sectional view taken along line B-B' of FIG. 9A. A semiconductor device 100*f* may include the substrate 101, channel holes CH extending in a direction perpendicular to an upper surface of the substrate 101, and including the channel region 140, channel pads 170*d* disposed at upper ends of the channel holes CH, the hole connecting portion CR connecting a space between channel holes CH, and a plurality of interlayer insulation layers 120 and a plurality of gate electrodes 130 stacked adjacent to outer walls of the channel region 140.

The semiconductor device 100*f* may include the hole connecting portion CR horizontally connecting the space between the channel holes CH under the second channel pad 174 and the third channel pad 176 on a side of the channel holes CH.

Referring to FIG. 9B, the hole connecting portion CR may connect the channel holes CH under the second channel pad 174 and the third channel pad 176 disposed adjacently, at heights at which the gate electrodes 136 and 137 of the string select transistor SST are positioned. Referring to FIG. 9A, the hole connecting portion CR may extend in a y direction, and may connect the space between the channel holes CH under the second channel pad 174 and the third channel pad 176. In some exemplary embodiments of the present inventive concept, the hole connecting portion CR may connect only a space between a single second channel pad 174 and a single third channel pad 176 without extending in the y direction.

The width L1 of the hole connecting portion CR may be changed, and layers disposed inside of the hole connecting portion CR may vary according to the width L1. For example, when the width L1 is relatively wide, a first insulation layer 162 material may be disposed in the center of the hole connecting portion CR. In some exemplary embodiments of the present inventive concept, when the width L1 is relatively narrow, the hole connecting portion CR need not be filled with the first insulation layer 162 material, and may be filled with the channel region 140 material.

A lower surface of the hole connecting portion CR may be disposed in an interlayer insulation layer 126, and an upper surface of the hole connecting portion CR may be disposed in a top interlayer insulation layer 128. The length L2 of the hole connecting portion CR and the positions of the upper and lower surfaces of the hole connecting portion CR may be changed according to an exemplary embodiment of the present inventive concept.

When the semiconductor device 100*f* operates, carriers may move along a portion of the channel region 140 in the hole connecting portion CR. Thus, when an electrical signal is applied to one of the second and third channel pads 174 and 176, the carriers may move to a portion of the channel region 140 under the channel pads 170*d* to which an electrical signal is not applied, through the hole connecting portion CR.

Figure 10A:
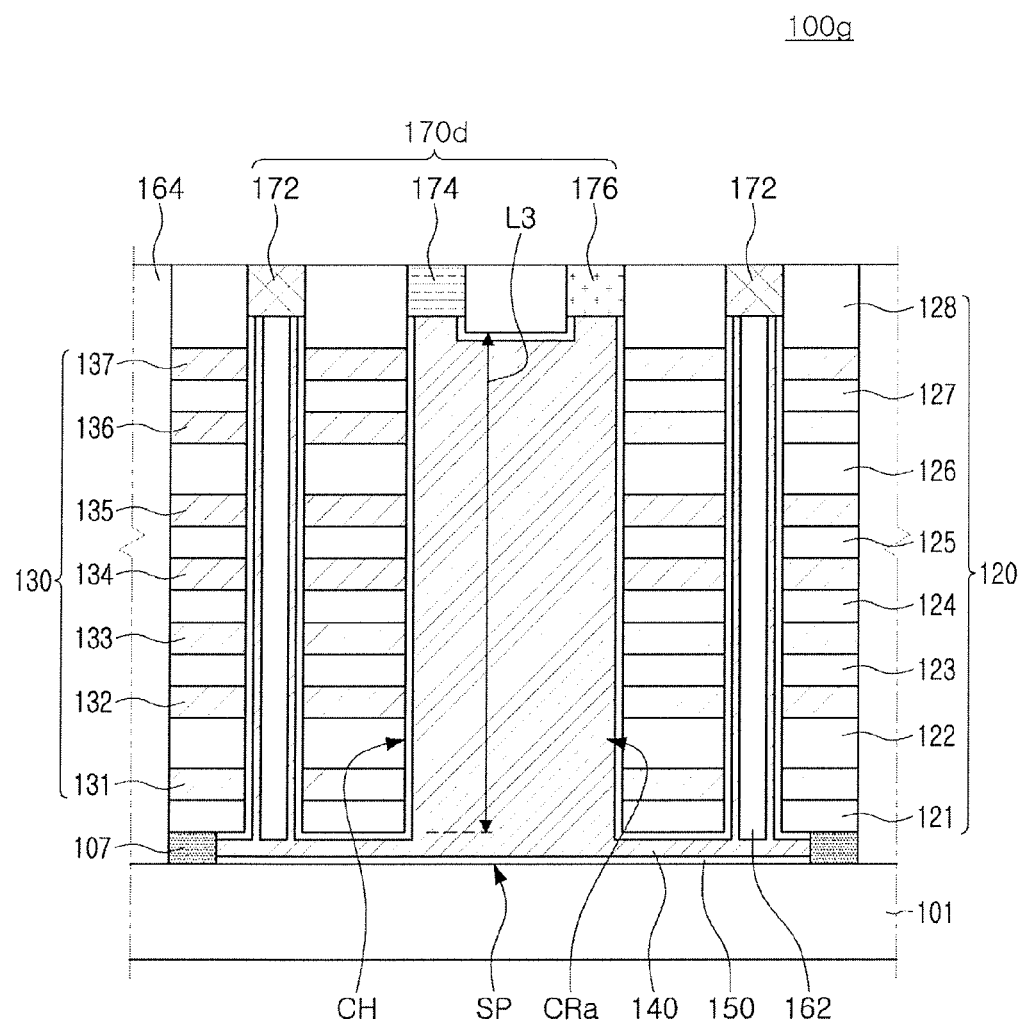
Figure 10B:
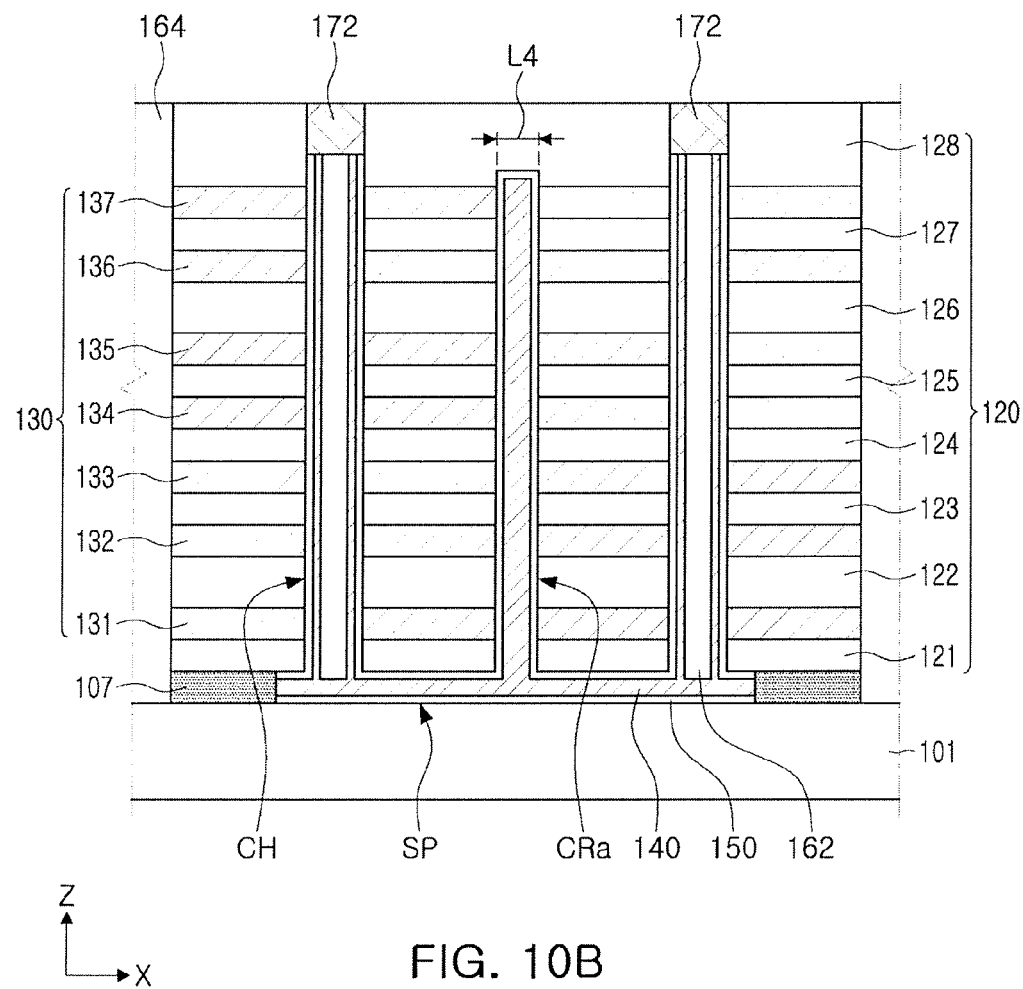

FIGS. 9B, 10A and 10B are schematic cross-sectional views of semiconductor devices according to an exemplary embodiment of the present inventive concept. Referring to FIGS. 10A and 10B, FIG. 10A is a cross-sectional view corresponding to FIG. 9B, and FIG. 10B is a cross-sectional view corresponding to a region taken along line XB-XB' of FIG. 9A. A semiconductor device 100*g* may include a hole connecting portion CRa connected to the horizontal portion SP. The hole connecting portion CRa may horizontally connect a space between channel holes CH under a second channel pad 174 and a third channel pad 176, and may extend vertically along the channel holes CH to be connected to the horizontal portion SP under the hole connecting portion CRa. According to an exemplary embodiment of the present inventive concept, the hole connecting portion CRa may be filled with a channel region 140 and a gate dielectric layer 150.

A height L3 of the hole connecting portion CRa from an upper surface of the horizontal portion SP may be changed in a range in which the upper surface is disposed below the channel pads 170d. A width L4 of the hole connecting portion CRa may also be changed.

Figure 11A:
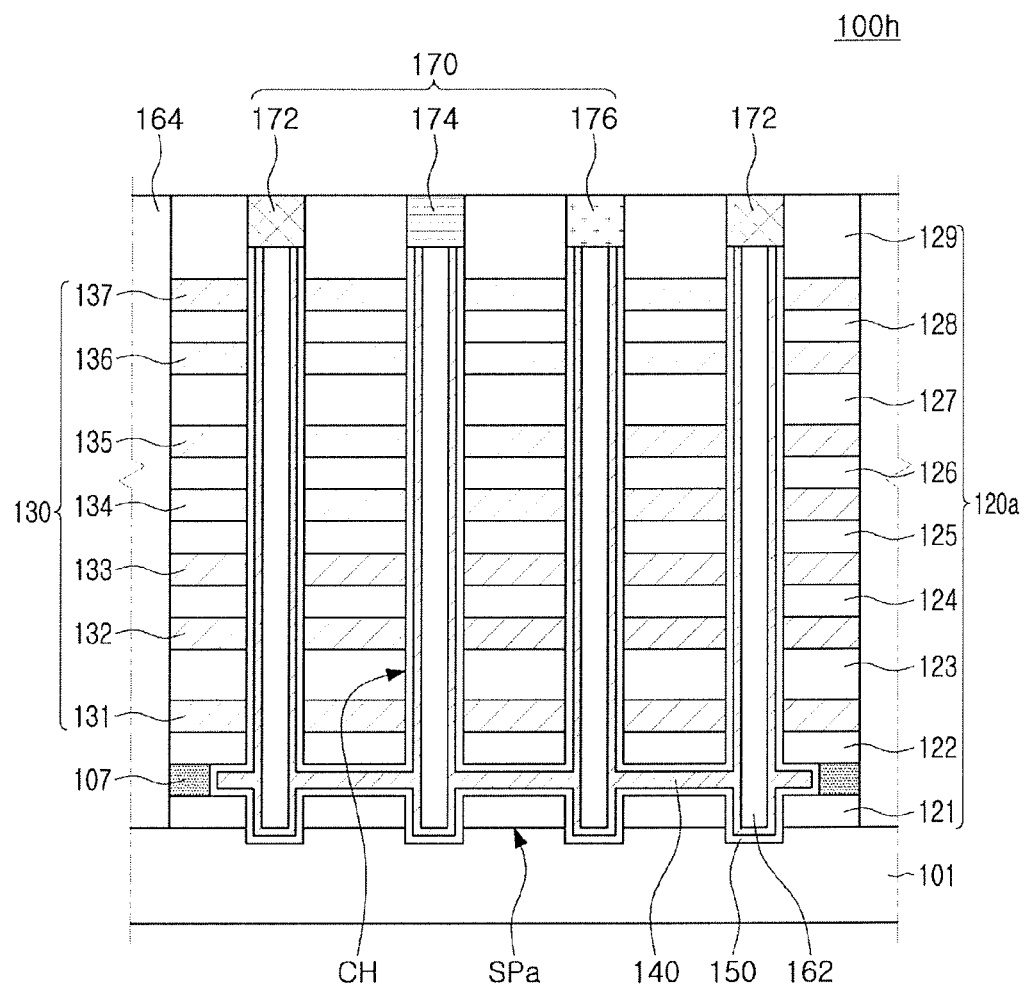
FIGS. 11A through 11C are schematic cross-sectional views of semiconductor devices according to an exemplary embodiment of the present inventive concept.

FIGS. 11A through 11O are schematic cross-sectional views of semiconductor devices according to an exemplary embodiment of the present inventive concept. FIGS. 11A through 11O are cross-sectional views corresponding to a region taken along line B-B' of the perspective view of FIG. 4.

Referring to FIG. 11A, a semiconductor device 100h may include the substrate 101, channel holes CH extending in a direction perpendicular to an upper surface of the substrate 101, and including the channel region 140 disposed in the channel holes CH, channel pads 170 disposed at upper ends of the channel holes CH, a horizontal portion SPa disposed on the substrate 101 and including a region in which the channel region 140 extends horizontally, horizontal filling layers 107 outside of the horizontal portion SPa, and a plurality of interlayer insulation layers 120a and a plurality of gate electrodes 130 stacked adjacent to outer walls of the channel region 140.

According to an exemplary embodiment of the present inventive concept, the horizontal portion SPa may be disposed on a bottom interlayer insulation layer 121 on the substrate 101. In some exemplary embodiments of the present inventive concept, the horizontal portion SPa may include two or more layers. The channel holes CH may also allow the substrate 101 to be recessed by a predetermined depth.

Figure 11B:
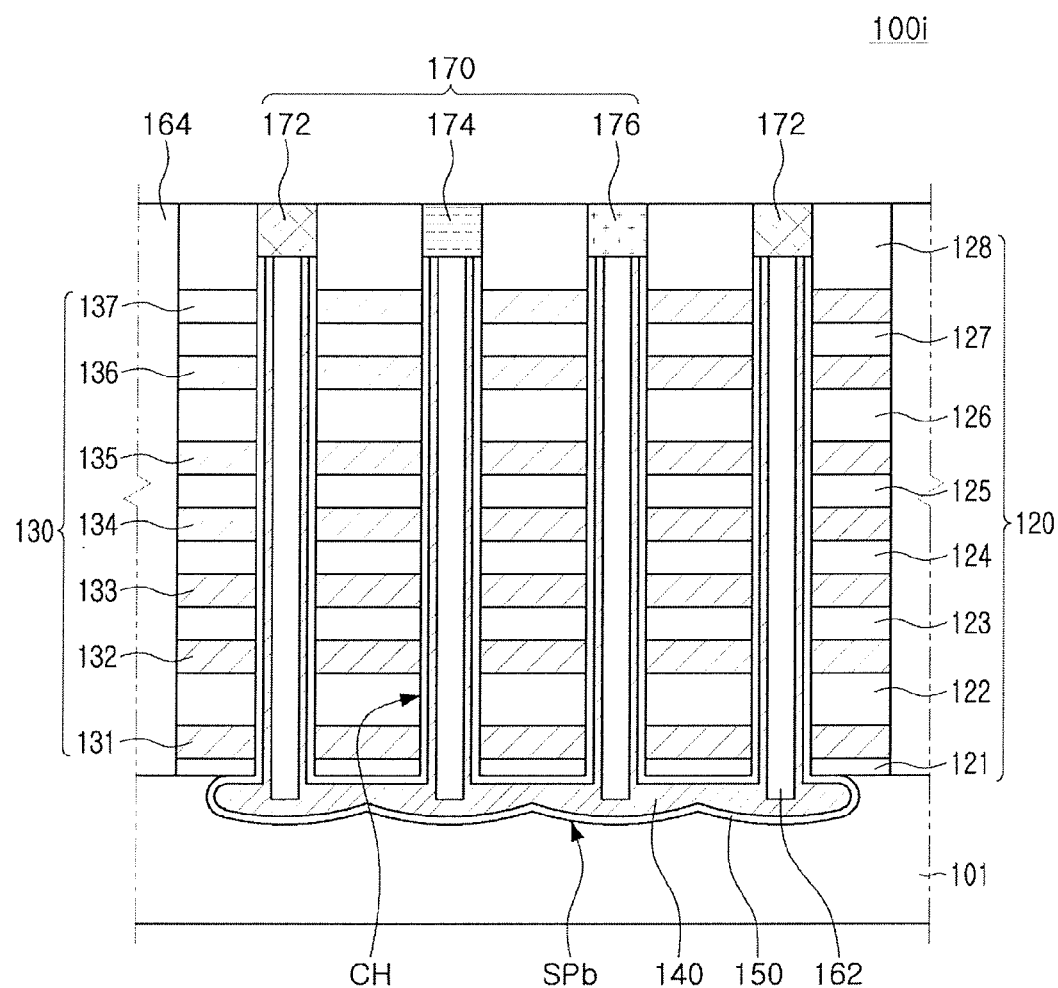

Referring to FIG. 11B, a horizontal portion SPb of a semiconductor device 100i may be disposed in a substrate 101. The horizontal portion SPb may be formed by forming channel holes CH and etching the substrate 101 exposed through the channel holes CH by a predetermined range. Thus, the depth of the horizontal portion SPb, and the shape of a lower surface of the horizontal portion SPb may be changed depending on manufacturing processes.

Figure 11C:
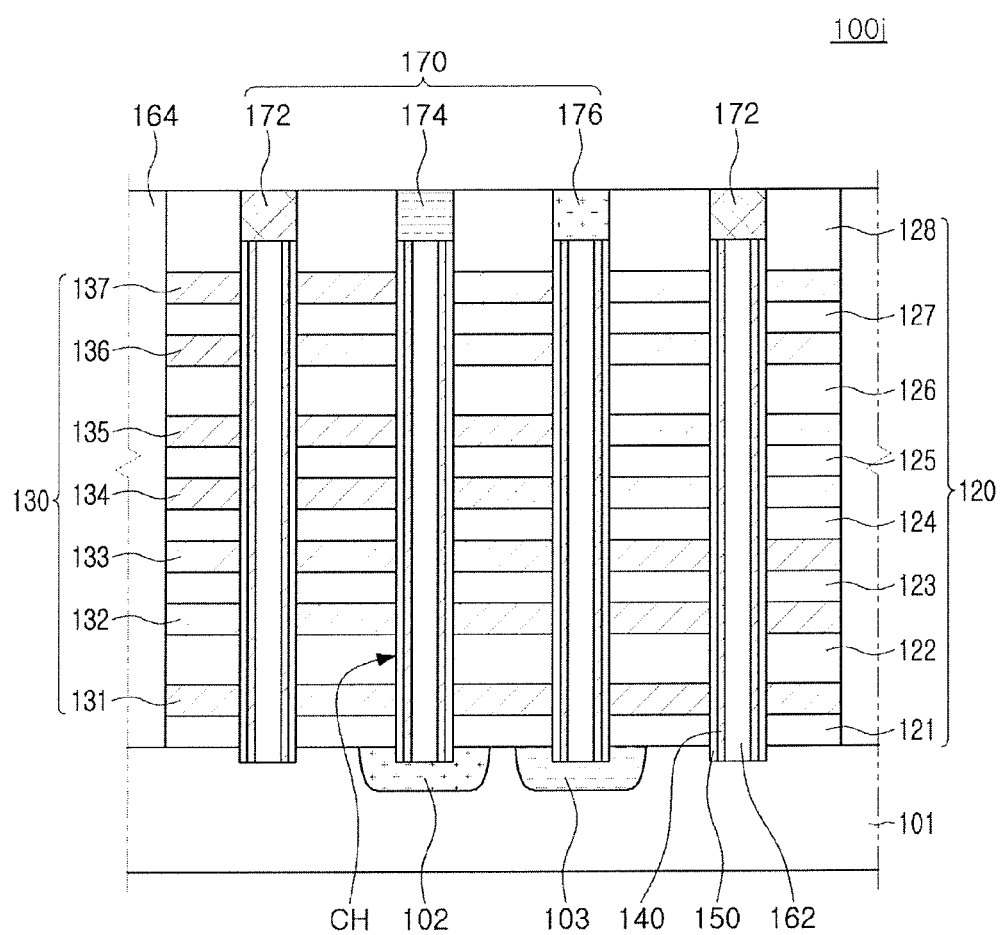

Referring to FIG. 11C, a semiconductor device 100j may include the substrate 101, channel holes CH extending in a direction perpendicular to an upper surface of the substrate 101, and including a channel region 140 disposed in the channel holes CH, channel pads 170 disposed at upper ends of the channel holes CH, a first impurity region 102 under a channel hole CH in which the second channel pad 174 is disposed, a second impurity region 103 under a channel hole CH in which the third channel pad 176 is disposed, and a plurality of interlayer insulation layers 120 and a plurality of gate electrodes 130 stacked adjacent to outer walls of the channel region 140.

According to an exemplary embodiment of the present inventive concept, the horizontal portions SP, SPa, and SPb may be omitted under the gate electrodes 130. Instead, the first and second impurity regions 102 and 103 may be disposed under the channel holes CH in which the second and third channel pads 174 and 176 are disposed, respectively.

The first and second impurity regions 102 and 103 may include different conductivity-type impurities, respectively.

For example, the first impurity region 102 may include first conductivity-type impurities substantially identical to that of the second channel pad 174, and the second impurity region 103 may include second conductivity-type impurities substantially identical to that of the third channel pad 176. The substrate 101 may include the second conductivity-type impurities in an amount less than that of the second impurity region 103. Thus, electrical signals applied from the second and third channel pads 174 and 176 may be transmitted to portions of the channel region 140 under the first channel pads 172 through the first and second impurity regions 102 and 103 and the substrate 101.

FIGS. 12A through 12I are views schematically illustrating a method of manufacturing a semiconductor device according to an exemplary embodiment of the present inventive concept. FIGS. 12A through 12I describe a method of manufacturing the semiconductor device 100, and are cross-sectional views taken along line B-B' of the perspective view of FIG. 4.

Figure 12A:
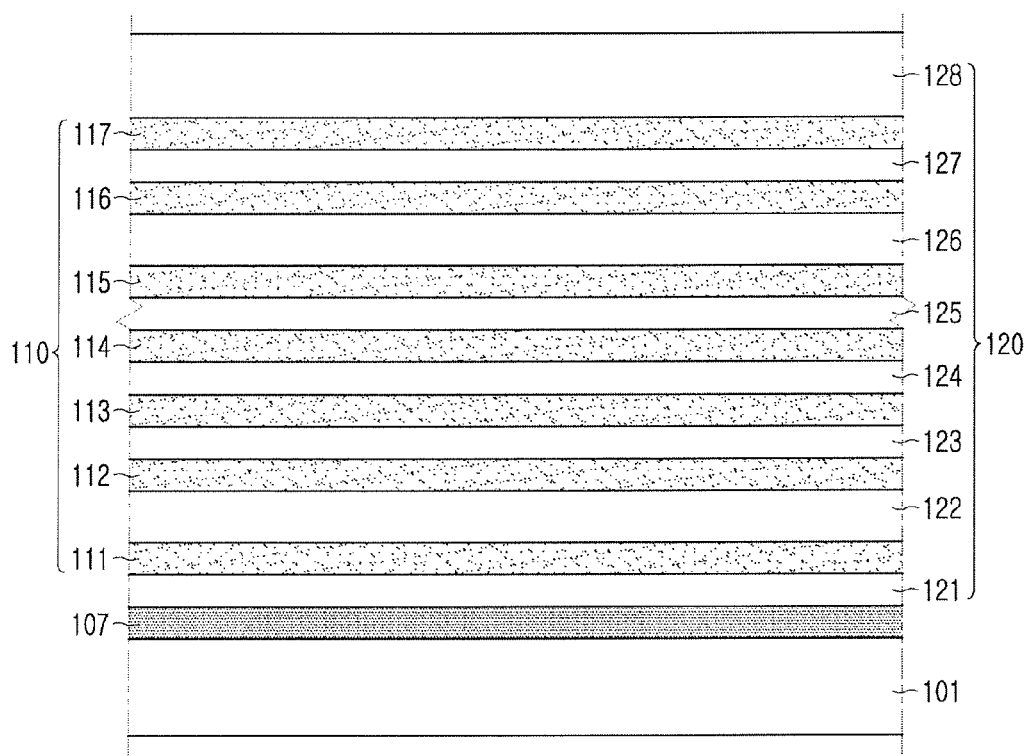
FIGS. 12A through 12I are views schematically illustrating a method of manufacturing a semiconductor device according to an exemplary embodiment of the present inventive concept.

Referring to FIG. 12A, the horizontal filling layer 107 may be formed on the substrate 101, and sacrificial layers 111 to 118 collectively represented by 110 and the interlayer insulation layers 120 may be alternately stacked. Using follow-up processes, portions of the horizontal filling layers 107 may be replaced with the horizontal portion SP of FIG. 4, and the sacrificial layers 110 may be substituted with the gate electrodes 130.

The horizontal filling layer 107 may be formed, and the sacrificial layers 110 and the interlayer insulation layers 120 may be alternately stacked on the substrate, as illustrated in FIG. 12A. The horizontal filling layer 107 and the sacrificial layers 110 may include a material that may be etched with etching selectivity for the interlayer insulation layers 120. For example, the horizontal filling layer 107 and the sacrificial layers 110 may include a material that may be etched while significantly reducing etching of the interlayer insulation layers 120 during a process of etching the horizontal filling layer 107 and the sacrificial layers 110. Such etching selectivity or an etching selection rate may be quantitatively represented with a rate of etching speed of the horizontal filling layer 107 and the sacrificial layers 110 to etching speed of the interlayer insulation layer 120. For example, the interlayer insulation layers 120 may include at least one of silicon oxide and silicon nitride, and the horizontal filling layer 107 and the sacrificial layers 110 may include a material selected from silicon, silicon oxide, silicon carbide and silicon nitride, and different from the material of the interlayer insulation layers 120. The horizontal filling layer 107 may include a material with etching selectivity for the sacrificial layers 110. For example, the horizontal filling layer 107 may include polycrystalline silicon, and the sacrificial layers 110 may include silicon nitride.

Referring to FIG. 12A, all of the thicknesses of the interlayer insulation layers 120 need not be the same as each other. For example, the top interlayer insulation layer 128 may be relatively thick. According to some exemplary embodiments of the present inventive concept, the interlayer insulation layers 122 and 126 disposed between the ground select transistor GST and the string select transistor SST, and the memory cells MC1 to MCn may have thicknesses relatively greater than those of the interlayer insulation layers 123 to 125 disposed between the memory cells MC1 to MCn. The thicknesses of the interlayer insulation layers 120, the horizontal filling layer 107, and the sacrificial layers 110 may be changed, and the number of layers forming the interlayer insulation layers 120, the horizontal filling layer 107, and the sacrificial layers 110 may also be changed.

Figure 12B:
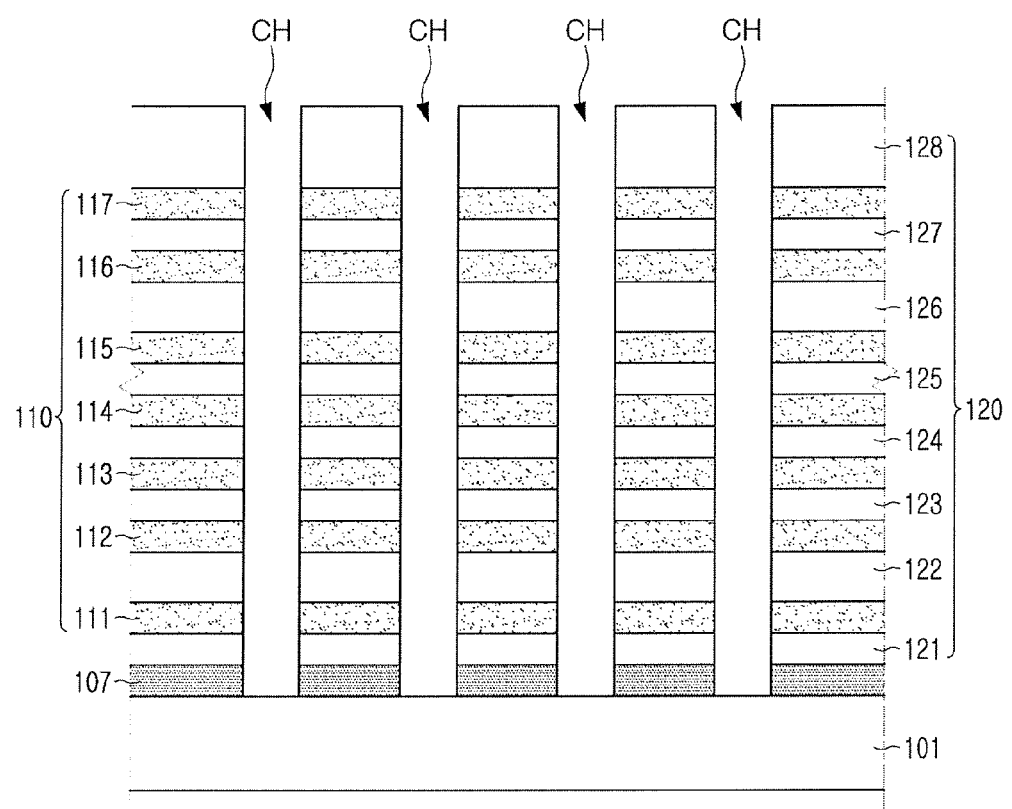

Referring to FIG. 12B, the channel holes CH may extend vertically to the substrate 101.

The channel holes CH may be formed by anisotropically etching the horizontal filling layer 107, the sacrificial layers 110, and the interlayer insulation layers 120. As a result of etching the stack structure including different types of layers, side walls of the channel holes CH need not be perpendicular to the upper surface of the substrate 101. According to some exemplary embodiments of the present inventive concept, the widths of the channel holes CH may be reduced towards the upper surface of the substrate 101.

According to some exemplary embodiments of the present inventive concept, the channel holes CH may allow portions of the substrate 101 to be recessed. According to some exemplary embodiments of the present inventive concept, the channel holes CH may only extend to an upper surface of the horizontal filling layer 107 or the inside of the horizontal filling layer 107, and thus the horizontal filling layer 107 may be exposed.

Figure 12C:
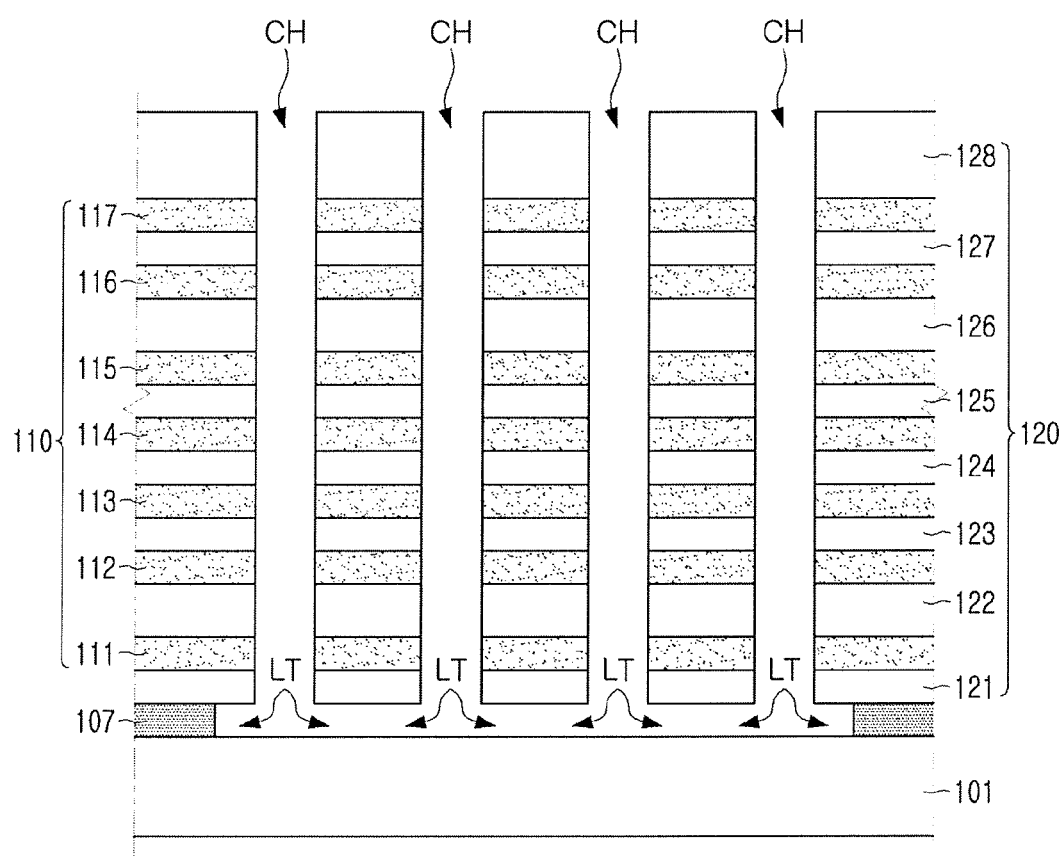

Referring to FIG. 12C, a portion of the horizontal filling layer 107 may be removed through the channel holes CH to form a lateral tunnel portion LT.

The horizontal filling layer 107 may be, for example, selectively removed while allowing the interlayer insulation layers 120 and the sacrificial layers 110 to remain using a dry etching process, such as gas phase etching (GPE). Control of process conditions, such as processing time, may allow only a portion of the horizontal filling layer 107 to be removed from the channel holes CH by a predetermined length.

The process conditions may allow the lateral tunnel portion LT to be formed, and the stack structure of the interlayer insulation layers 120 and the sacrificial layers 110 on the lateral tunnel portion LT may be supported by the remainder of the horizontal filling layers 107.

According to some exemplary embodiments of the present inventive concept, the horizontal filling layer 107 may include a plurality of horizontally disposed layers, and removal of one of the plurality of layers may form the lateral tunnel portion LT.

Figure 12D:
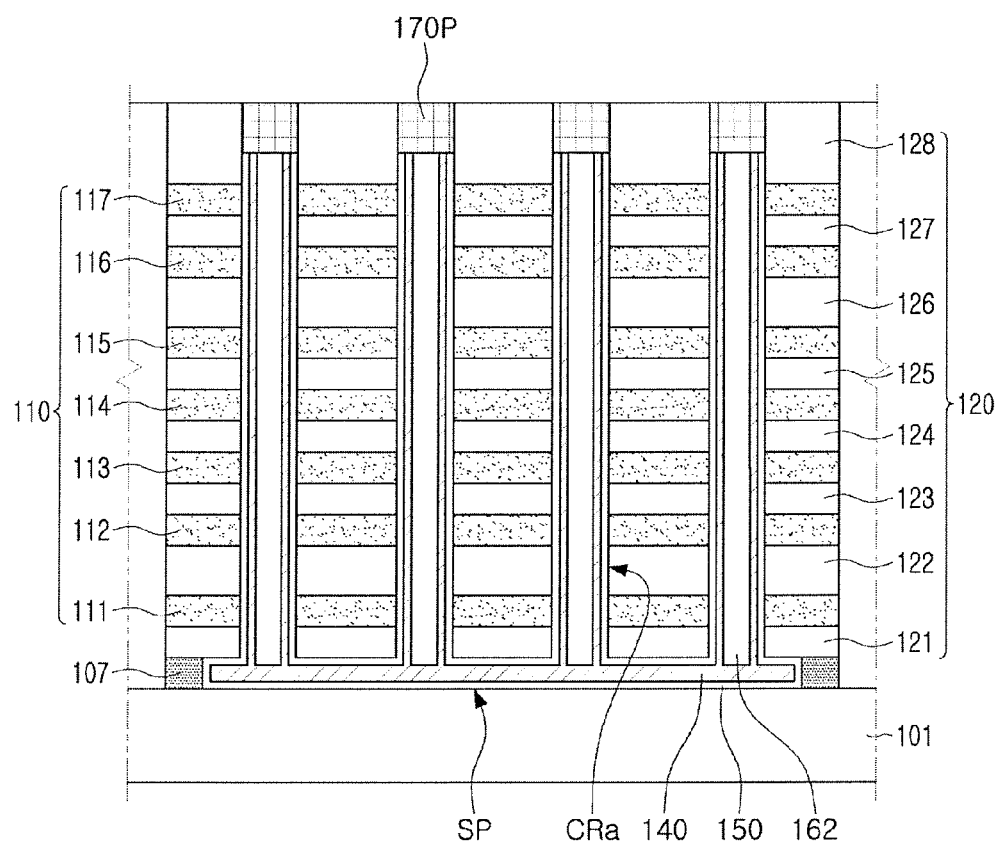

Referring to FIG. 12D, the channel holes CH may include the gate dielectric layer 150, the channel region 140, the first insulation layers 162, and preparatory channel pads 170P.

The gate dielectric layer 150 may have a substantially uniform thickness. The gate dielectric layer 150 may be formed by atomic layer deposition (ALD) or chemical vapor deposition (CVD). According to an exemplary embodiment of the present inventive concept, the gate dielectric layer 150 may be may be fully or partially formed. That is, portions of the gate dielectric layers 150, extending perpendicularly with respect to the substrate 101 along the channel holes CH, may be formed. The channel region 140 may be formed on the gate dielectric layer 150 in the channel holes CH.

The gate dielectric layer 150 may be substantially uniformly formed even in the lateral tunnel portion LT, and the channel region 140 may fill an empty space in the lateral tunnel portion LT. Thus, the horizontal portion SP may be formed. According to some exemplary embodiments of the present inventive concept, the channel region 140 may be substantially uniformly formed adjacent to the gate dielectric layer 150 in the lateral tunnel portion LT without filling the lateral tunnel portion LT.

The first insulation layers 162 may fill the channel holes CH, and may include an insulating material. According to some exemplary embodiments of the present inventive concept, spaces between portions of the channel regions 140 may be filled with a conductive material, and might not be filled with the first insulation layers 162.

The preparatory channel pads 170P may include a conductive material. The preparatory channel pads 170P may include, for example, polycrystalline silicon.

Figure 12E:
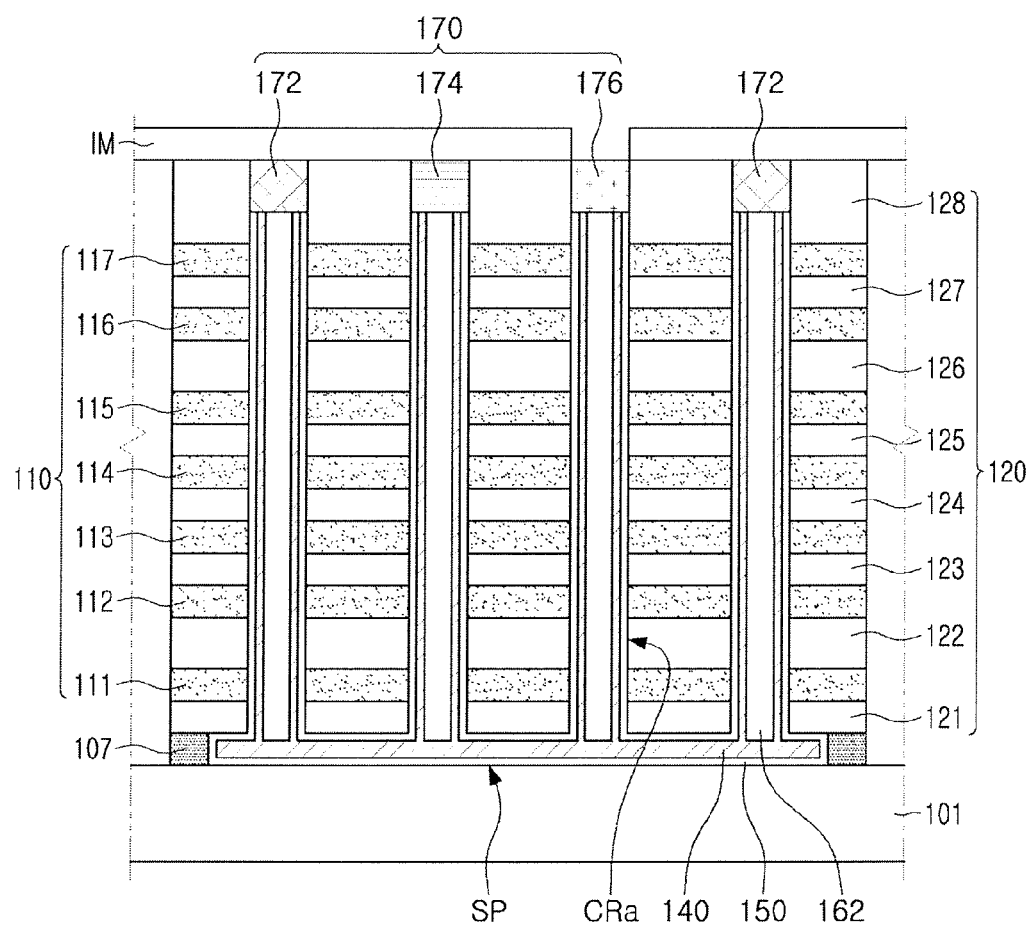

Referring to FIG. 12E, the first to third channel pads 172, 174, and 176 may be formed by implanting impurities to the preparatory channel pads 170P.

First conductivity-type impurities may be injected into the preparatory channel pads 170P, a mask layer IM may be formed on the preparatory channel pads 170P to expose only a region in which the third channel pad 176 is formed, and then the third channel pad 176 may be injected with second conductivity-type impurities. Alternatively, the first conductivity-type material may also be injected only into respective regions in which the first and second channel pads 172 and 174 are formed, using a separate mask layer.

According to some exemplary embodiments of the present inventive concept, the first and second conductivity-type impurities may be injected when the channel pads 170 are formed without being put through a process such as an ion implantation process. In this case, the first and second channel pads 172 and 174 including the first conductivity-type impurities and the third channel pad 176 including the second conductivity-type impurities may be formed in different process steps.

Figure 12F:
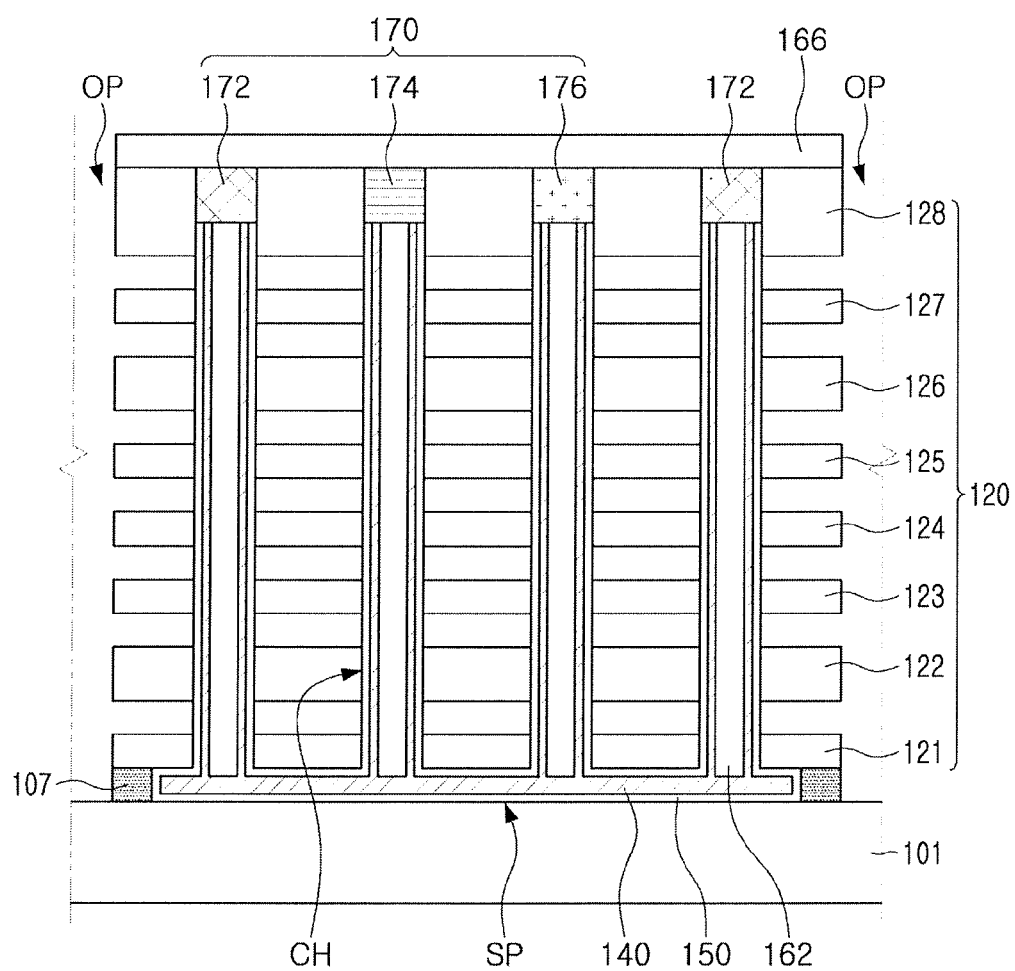

Referring to FIG. 12F, openings OP may be formed, and the sacrificial layers 110 exposed through the openings OP may be removed.

Prior to removing the sacrificial layers 110, in order to protect the channel pads 170 and the channel region 140 under the sacrificial layers 110, a third insulation layer 166 may be formed on the channel pads 170.

The sacrificial layers 110 may be selectively removed with respect to the interlayer insulation layers 120 and the horizontal filling layers 107.

Figure 12G:
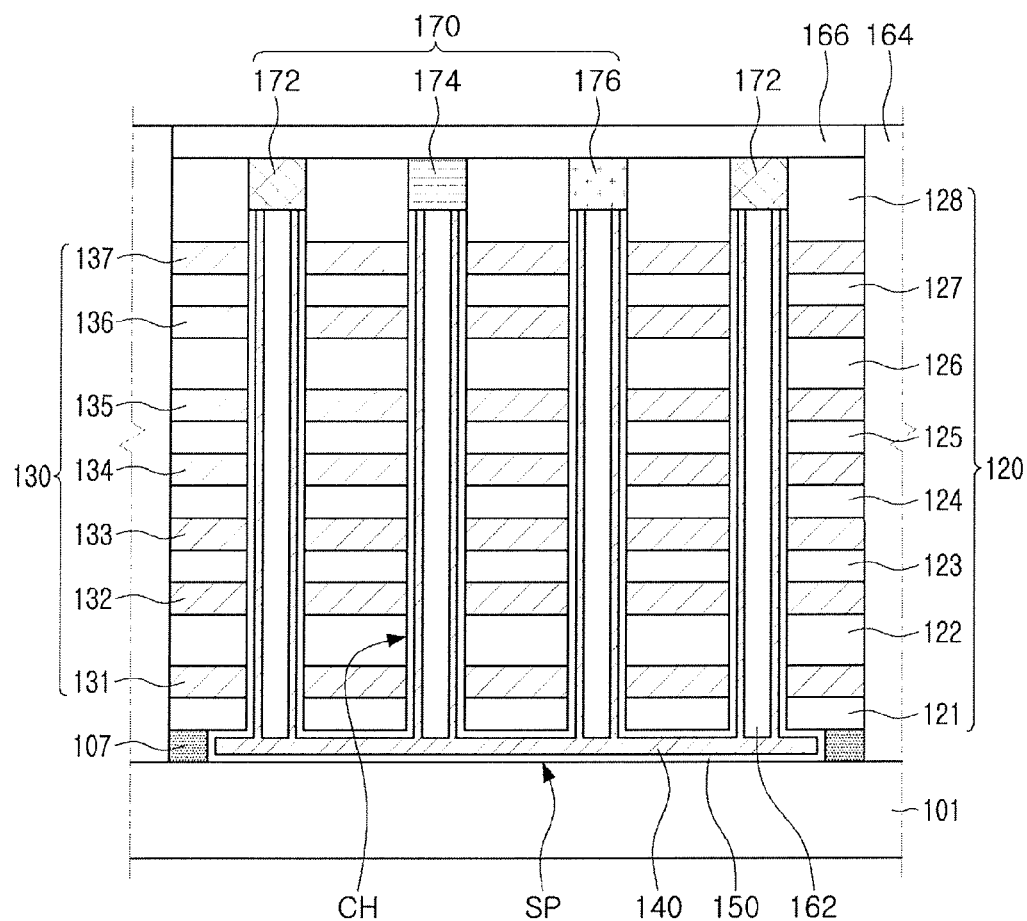

Referring to FIG. 12G, the gate electrodes 130 may be formed in regions from which the sacrificial layers 110 have been removed, and the second insulation layers 164 may be formed in the openings OP.

The gate electrodes 130 may include metal, polycrystalline silicon or a metal silicide material. The metal silicide material may be, for example, a silicide material of a metal selected from cobalt (Co), nickel (Ni), hafnium (Hf), platinum (Pt), tungsten (W) and titanium (Ti), or combinations thereof. When the gate electrodes 130 include the metal silicide material, a siliciding process of filling the openings OP with silicon (Si) and then forming a separate metal layer may be performed to form the gate electrodes 130.

After the forming of the gate electrodes 130, a material forming the gate electrodes 130 formed in the openings OP may be removed. The gate electrodes 130 may be formed such that the interlayer insulation layers 120 may protrude from the gate electrodes 130 towards the openings OP.

The second insulation layers 164 may be formed in the openings OP. The second insulation layers 164 may be an isolation insulation layer isolating adjacent stack structures from each other, and may extend in a direction along with the gate electrodes 130.

Figure 12H:
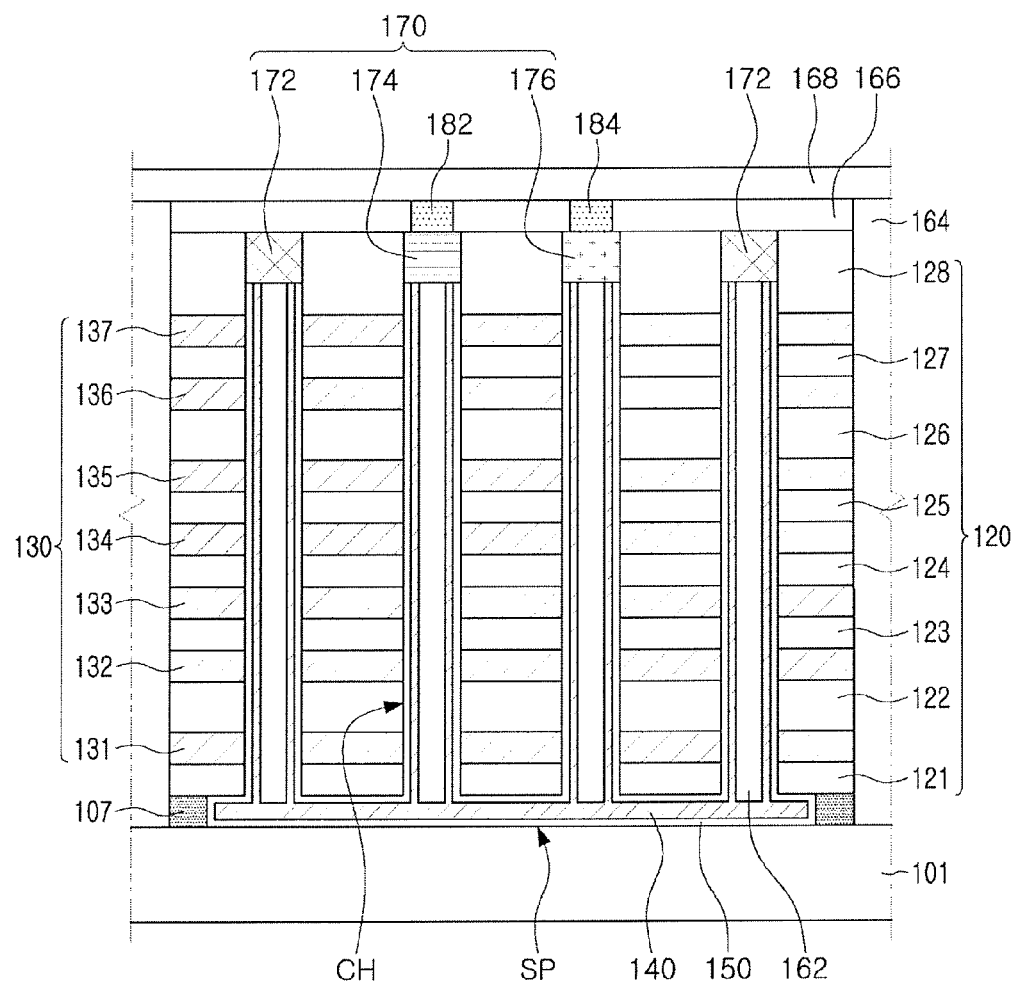

Referring to FIG. 12H, the first and second conductive lines 182 and 184 may be formed on the second and third channel pads 174 and 176, respectively.

The first and second conductive lines 182 and 184 may be formed by patterning the third insulation layer 166 such that the second and third channel pads 174 and 176 may be exposed, and then depositing a conductive material. Alternatively, the first and second conductive lines 182 and 184 may be formed by removing the third insulation layer 166, depositing a conductive material, and patterning the conductive material.

A fourth insulation layer 168 covering the first and second conductive lines 182 and 184 may be formed.

Figure 12I:
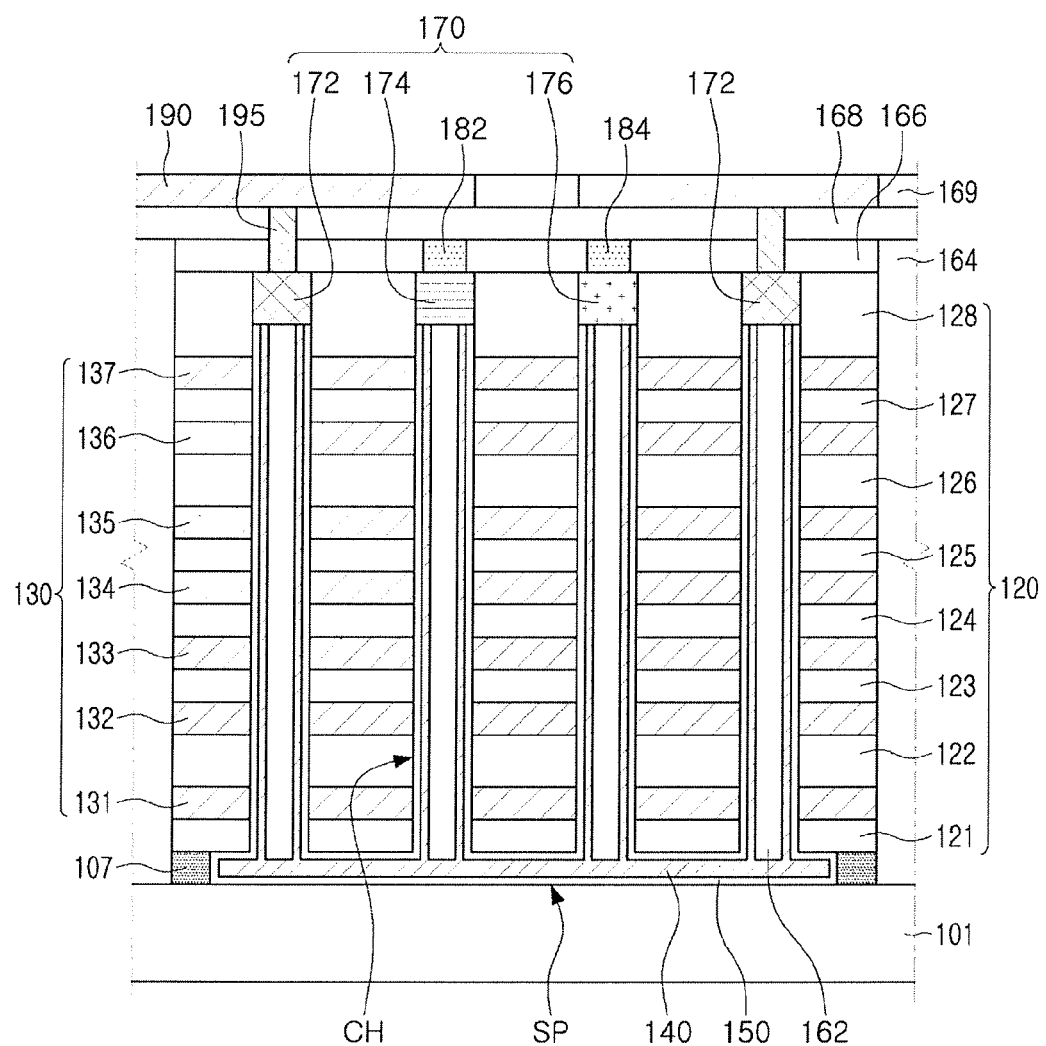

Referring to FIG. 12I, the contact plugs 195 and the bit lines 190 may be formed.

The contact plugs 195 may be formed by etching the third and fourth insulation layers 166 and 168 to expose the first channel pads 172, and then filling exposed portions of the third and fourth insulation layers 166 and 168 with a conductive material.

The bit lines 190 and a fifth insulation layer 169 may be formed on the contact plugs 195. The bit lines 190 may be disposed such that the second channel pads 172 arranged in a column in the x direction may be connected to different bit lines 190. The bit lines 190 may be connected to the second channel pads 172 by interconnection lines and contact plugs.

FIGS. 13A through 13D are views schematically illustrating a method of manufacturing a semiconductor device according to an exemplary embodiment of the present inventive concept. FIGS. 13A through 13D describe a method of manufacturing the semiconductor device 100f, and are cross-sectional views taken along line XB-XB' of FIG. 9A. Duplicative descriptions of aspects of exemplary embodiments of the present inventive concept described above with reference to FIGS. 12A through 12I may be omitted.

The stack structure of the horizontal filling layer 107, the first sacrificial layers 110, and the interlayer insulation layers 120 may be formed.

Figure 13A:
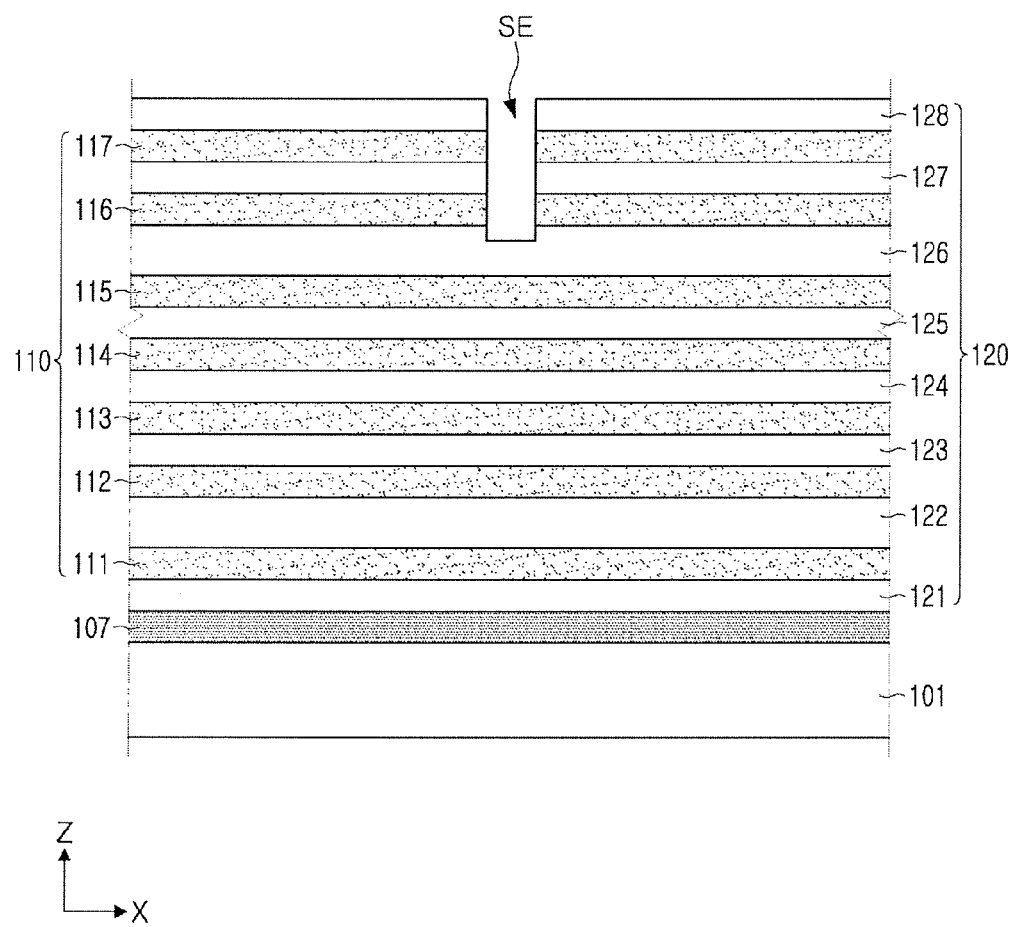
FIGS. 13A through 13D are views schematically illustrating a method of manufacturing a semiconductor device according to an exemplary embodiment of the present inventive concept.

Referring to FIG. 13A, portions of the first sacrificial layers 110 and the interlayer insulation layers 120 may be removed to form a trench region SE.

The trench region SE may be formed by performing an etching process using a separate mask layer. The trench region SE may include a region in which the hole connecting portion CR of FIG. 9A is to be formed, and may have a trench shape extending in the y direction. The depth of the trench region SE may be determined according to the depth of the hole connecting portion CR, and the trench region SE may extend, for example, to the inside of the interlayer insulation layer 126 to be disposed under the gate electrode 136 of the string select transistor SST.

Figure 13B:
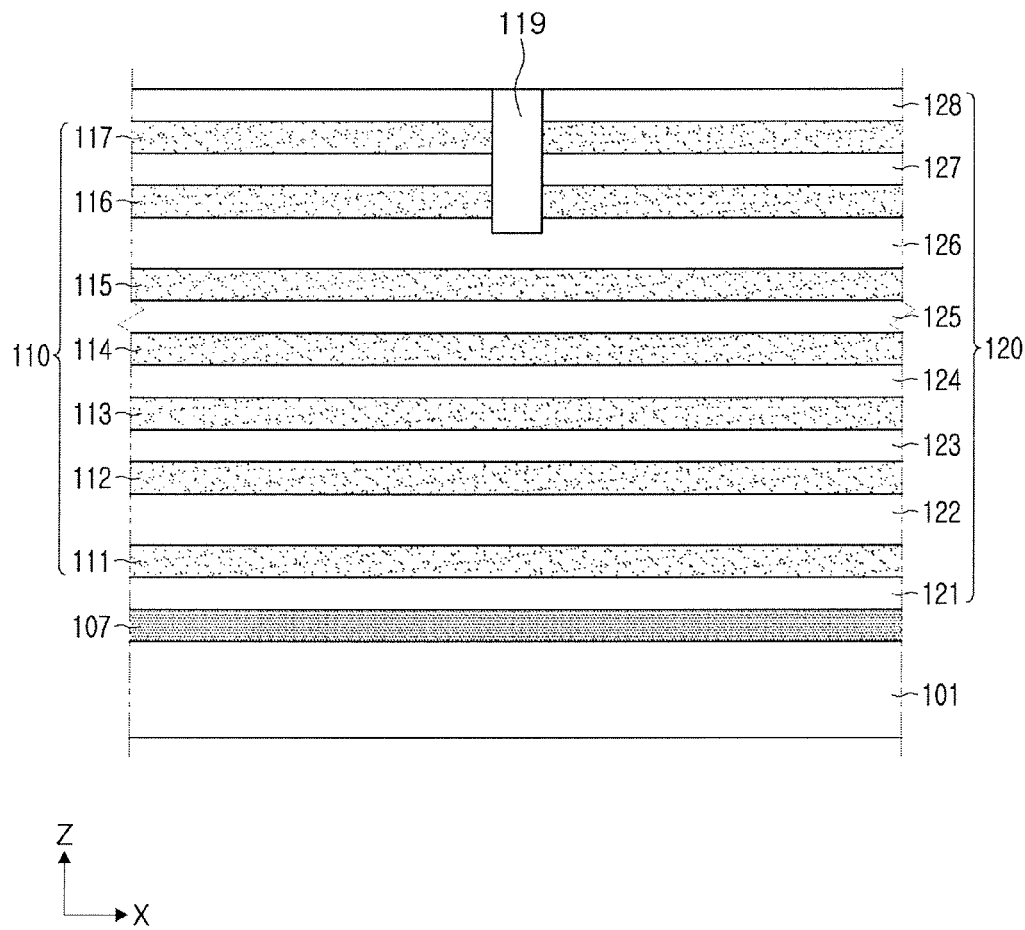

Referring to FIG. 13B, the trench region SE may be filled with a second sacrificial layer 119.

The second sacrificial layer 119 may include a material that may be etched with etching selectivity for the first sacrificial layers 110 and the interlayer insulation layers 120. For example, the second sacrificial layer 119 may include a material substantially identical to that of the horizontal filling layer 107, but exemplary embodiments of the present inventive concept are not limited thereto.

Figure 13C:
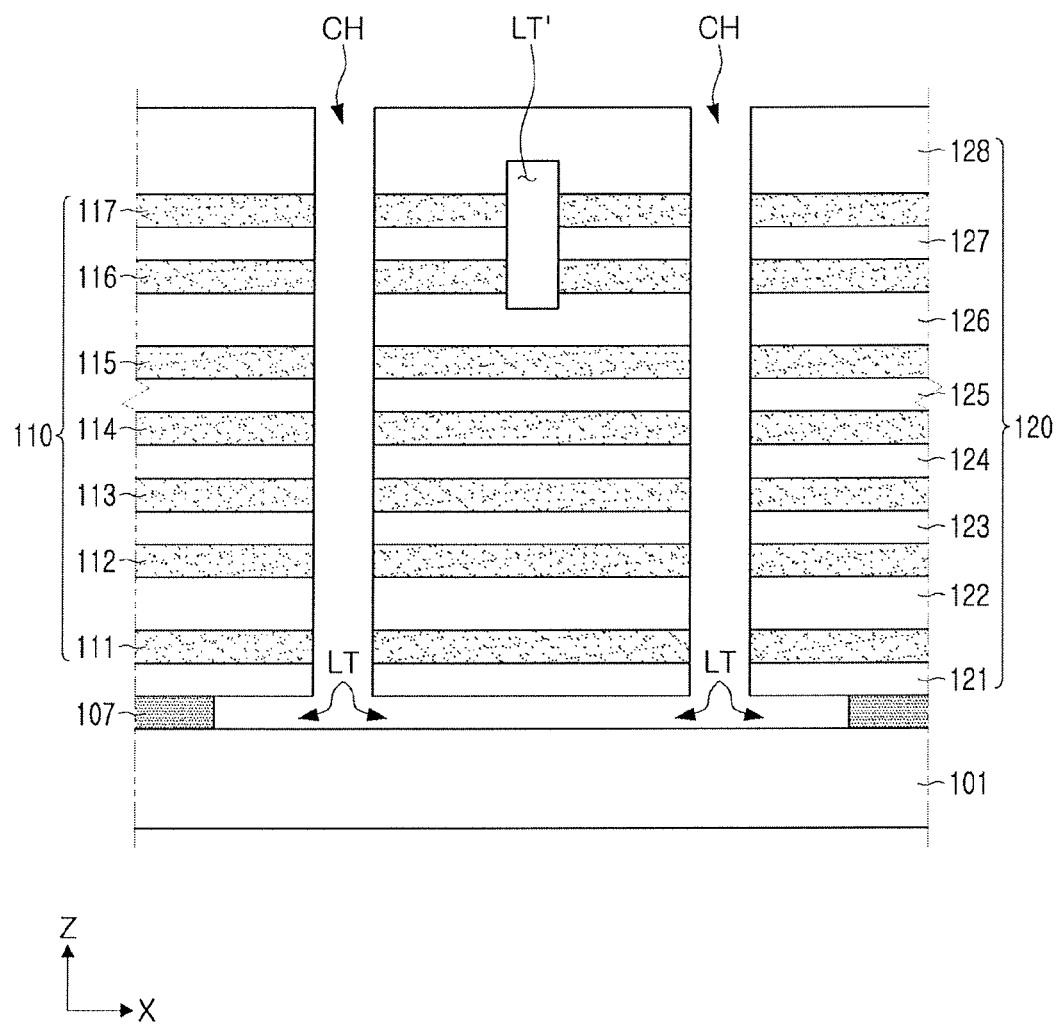

Referring to FIG. 13C, the channel holes CH extending vertically to the substrate 101 may be formed, and the first lateral tunnel portion LT and a second lateral tunnel portion LT' may be formed by removing a portion of the horizontal filling layer 107 and the second sacrificial layer 119 through the channel holes CH.

Prior to forming the channel holes CH, an additional material forming the interlayer insulation layers 120 may be deposited in the channel holes CH, which may increase a thickness of the top interlayer insulation layer 128.

The channel holes CH may be formed such that the substrate 101 may be exposed, and then the portion of the horizontal filling layer 107 and the second sacrificial layer 119 may be removed using a dry etching process, such as gas phase etching (GPE). Thus, the first lateral tunnel portion LT may be formed in lower portions of the channel holes CH, and the second lateral tunnel portion LT' may be formed in a region from which the second sacrificial layer 119 is removed. The second sacrificial layer 119 formed on the position of the hole connecting portion CR may be connected to the channel holes CH disposed on a straight line in the y direction, and an etchant may flow in the second sacrificial layer 119 from these channel holes CH to remove the second sacrificial layer 119, and thus the second lateral tunnel portion LT' may be formed.

Figure 13D:
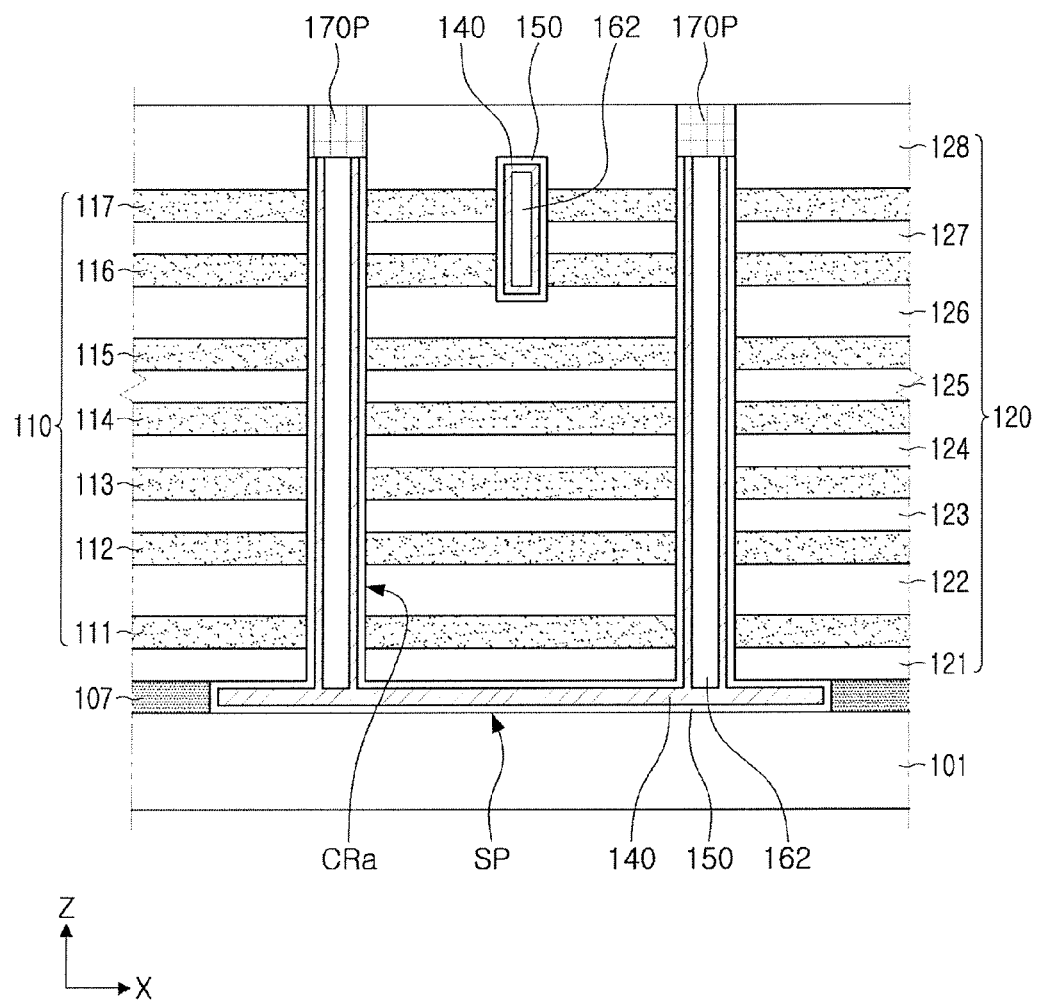

Referring to FIG. 13D, the gate dielectric layer 150, the channel region 140, and the first insulation layers 162 may be formed in the channel holes CH and the first and second lateral tunnel portions LT and LT', and then the preparatory channel pads 170P may be formed.

The gate dielectric layer 150 may be substantially uniformly formed even in the lateral tunnel portion LT, and the channel region 140 may fill an empty space in the lateral tunnel portion LT. Thus, the horizontal portion SP may be formed.

The gate dielectric layer 150 may be substantially uniformly formed even in the second lateral tunnel portion LT', and the channel region 140 may be uniformly formed in the second lateral tunnel portion LT' adjacent to the gate dielectric layer 150. Remaining spaces in the second lateral tunnel portion LT' may be filled with the first insulation layers 162. Thus, the hole connecting portion CR may be formed. According to some exemplary embodiments of the present inventive concept, the second lateral tunnel portion LT' may be filled with the channel region 140.

Next, the processes described above with reference to FIGS. 12E through 12I may be performed, and thus the semiconductor device 100f may be formed.

Figure 14:
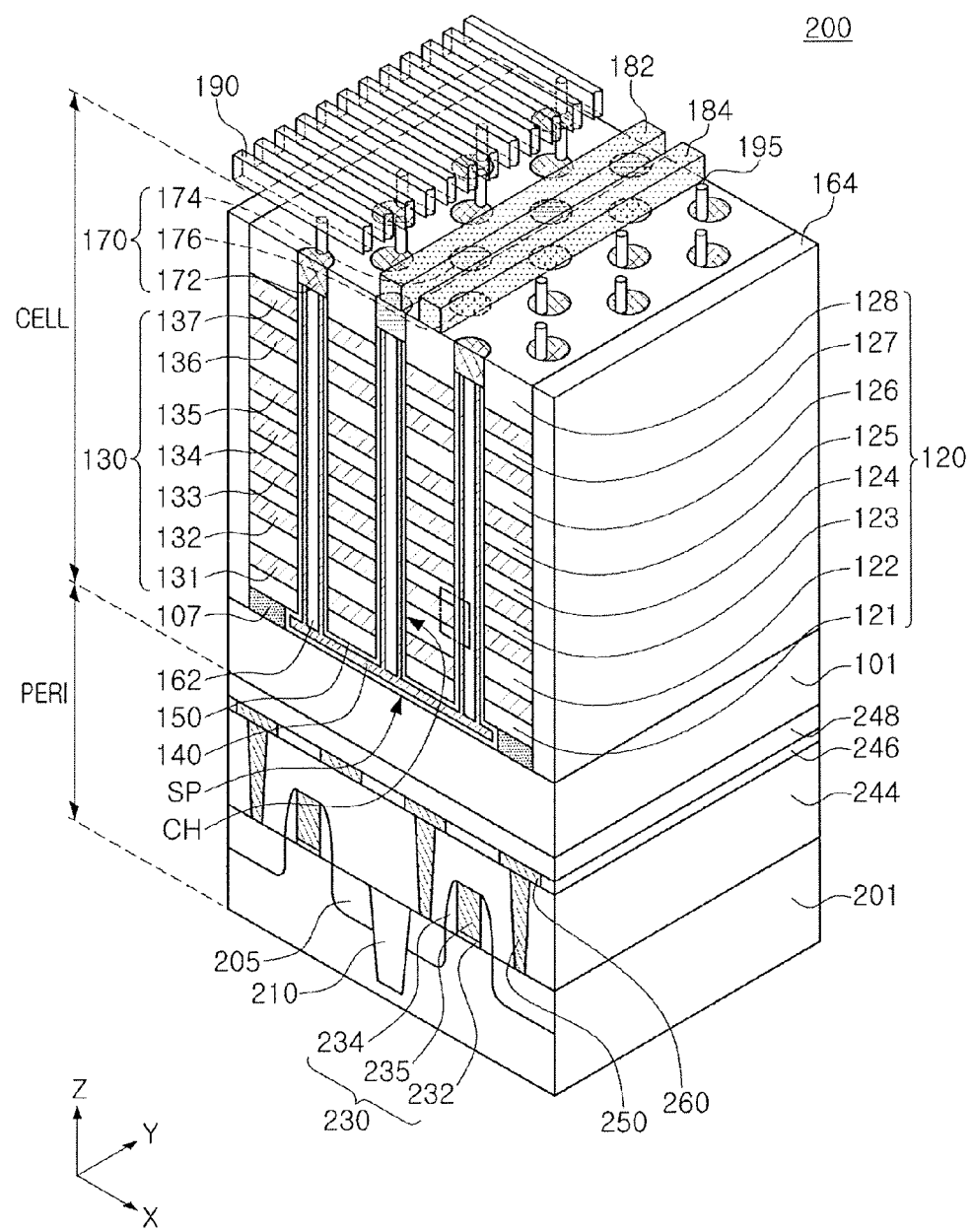
FIG. 14 is a schematic perspective view of a semiconductor device according to an exemplary embodiment of the present inventive concept.

FIG. 14 is a schematic perspective view of a semiconductor device according to an exemplary embodiment of the present inventive concept.

Referring to FIG. 14, a semiconductor device 200 may include a cell region CELL and a peripheral circuit region PERI.

The cell region CELL may correspond to a region in which the memory cell array 20 is disposed, and the peripheral circuit region PERI may correspond to a region in which the driving circuit 30 of the memory cell array 20 is disposed. The cell region CELL may be disposed on the peripheral circuit region PERI. According to some exemplary embodiments of the present inventive concept, the cell region CELL may be disposed under the peripheral circuit region PERI.

The cell region CELL may include the substrate 101, channel holes CH extending in a direction perpendicular to an upper surface of the substrate 101, and including the channel region 140 disposed in the channel holes CH, channel pads 170 disposed at upper ends of the channel holes CH, a horizontal the portion SP disposed on the substrate 101 and including a region in which the channel region 140 extends horizontally, horizontal filling layers 107 outside of the horizontal portion SP, and a plurality of interlayer insulation layers 120 and a plurality of gate electrodes 130 stacked adjacent to outer walls of the channel region 140. The semiconductor device 200 may include the gate dielectric layer 150, the first conductive line 182, the second conductive line 184, contact plugs 195, and bit lines 190.

According to an exemplary embodiment of the present inventive concept, the cell region CELL may have the same structure as the exemplary embodiment of the present inventive concept illustrated in FIG. 4, but exemplary embodiments of the present inventive concept are not limited thereto. The cell region CELL may include a semiconductor device according to various exemplary embodiments of the present inventive concept.

The peripheral circuit region PERI may include a base substrate 201, circuit devices 230 disposed on the base substrate 201, contact plugs 250, and interconnection lines 260.

The base substrate 201 may have an upper surface extending in an x direction and a y direction. The base substrate 201 may include a device isolation layer 210, which may define an active region. A doping region 205 including impurities may be disposed in a portion of the active region. The base substrate 201 may include a semiconductor material, for example, a group IV semiconductor, a group III-V compound semiconductor, or a group II-VI oxide semiconductor.

The circuit devices 230 may each include planar transistors. Each of the circuit devices 230 may include a circuit gate insulation layer 232, a spacer layer 234, and a circuit gate electrode 235. Portions of the doping region 205 may be disposed on both sides of the circuit gate electrode 235 in the base substrate 201, and may act as a source region or a drain region of the circuit device 230.

A plurality of peripheral region insulation layers 244, 246, and 248 may be disposed on the circuit device 230 on the base substrate 201.

The contact plugs 250 may penetrate through the peripheral region insulation layer 244 to be connected to the doping region 205. The contact plugs 250 may allow an electrical signal to be applied to the circuit device 230. In a region not illustrated, the contact plugs 250 may be connected to the circuit gate electrode 235. The interconnection lines 260 may be connected to the contact plugs 250 and in certain exemplary embodiments of the present inventive concept, may be disposed in a plurality of layers.

After the peripheral circuit region PERI is manufactured, the substrate 101 of the cell region CELL may be formed on the peripheral circuit region PERI to manufacture the cell region CELL. The substrate 101 may have substantially the same size as the base substrate 201, or may be smaller than the base substrate 201. The substrate 101 may include polycrystalline silicon or amorphous silicon, which may be crystallized.

The cell region CELL and the peripheral circuit region PERI may be connected to each other in a region not illustrated. For example, an end of the gate electrodes 130 in the y direction may be electrically connected to the circuit device 230. The first and second conductive lines 182 and 184 and the bit lines 190 may be connected to different circuit devices 230 of the peripheral circuit region PERI.

Figure 15:
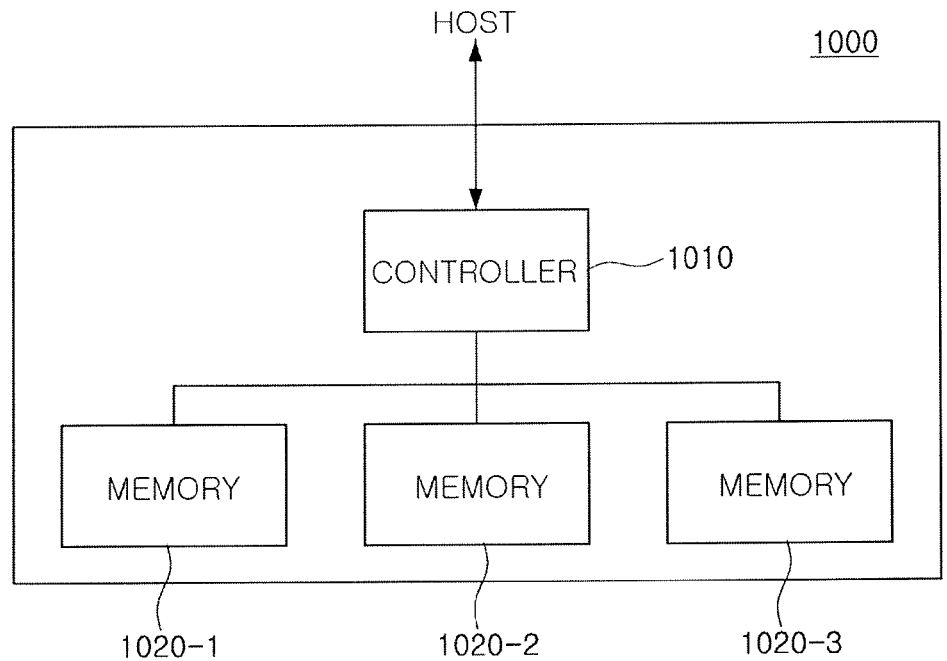
FIG. 15 is a block diagram of a storage device including a semiconductor device according to an exemplary embodiment of the present inventive concept.

FIG. 15 is a block diagram of a storage device including a semiconductor device according to an exemplary embodiment of the present inventive concept.

Referring to FIG. 15, a storage device 1000 according to an exemplary embodiment of the present inventive concept may include a controller 1010 communicating with a host HOST and memories 1020-1, 1020-2, and 1020-3 storing data. The memories 1020-1, 1020-2, and 1020-3 may each include semiconductor devices according to various exemplary embodiments of the present inventive concept.

The host communicating with the controller 1010 may be various types of electronic devices including the storage device 1000, for example, a smartphone, a digital camera, a desktop, a laptop PC, and a media player. The controller 1010 may receive a data write or read request transmitted from the host HOST to store data in the memories 1020-1, 1020-2, and 1020-3 or generate a command for retrieving data from the memories 1020-1, 1020-2, and 1020-3.

At least one of the memories 1020-1, 1020-2, and 1020-3 may be connected to the controller 1010 in parallel in the storage device 1000. By connecting the plurality of memories 1020-1, 1020-2, and 1020-3 to the controller 1010 in parallel, the storage device 1000 having a large capacity may be implemented, such as a solid state drive (SSD).

Figure 16:
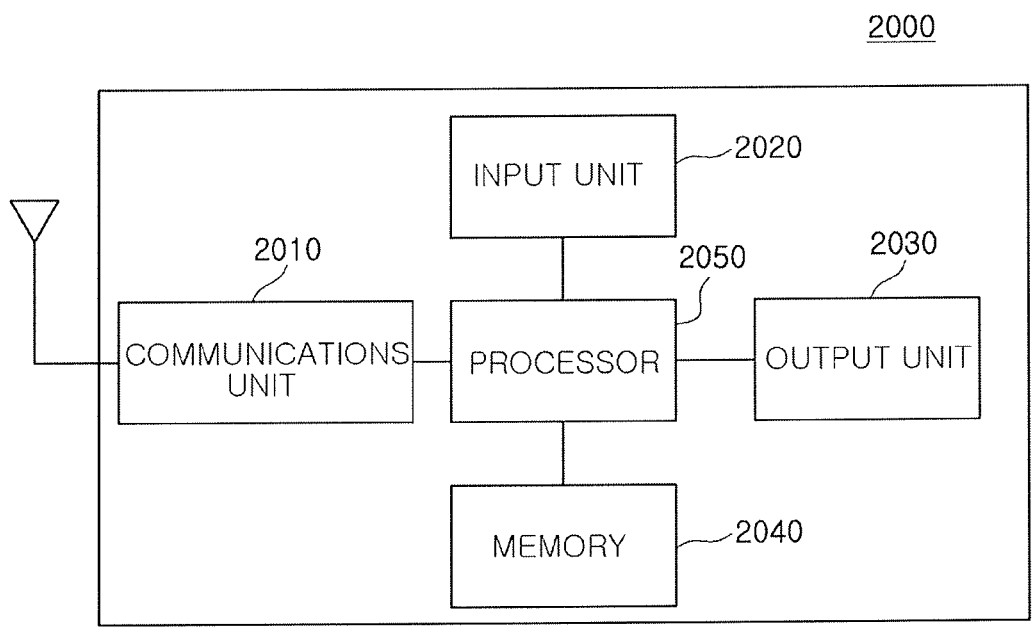
FIG. 16 is a block diagram of an electronic device including a semiconductor device according to an exemplary embodiment of the present inventive concept.

FIG. 16 is a block diagram of an electronic device including a semiconductor device according to an exemplary embodiment of the present inventive concept.

Referring to FIG. 16, an electronic device 2000 according to an exemplary embodiment of the present inventive concept may include a communication unit 2010, an input unit 2020, an output unit 2030, a memory 2040, and a processor 2050.

The communication 2010 may include wire and wireless communications modules, such as, a wireless Internet module, a local communications module, a global positioning system (GPS) module, or a module communications module. The wire/wireless communications module included in the communication unit 2010 may be connected to an external communications network based on various communications standards to transmit and receive data.

The input unit 2020 may include a mechanical switch, a touchscreen, or a voice recognition module, as a module provided for a user to control operation of the electronic device 2000. The input unit 2020 may include a mouse or a finger mouse device operating based on a track ball or laser pointer, and may include various sensor modules which enable a user to input data.

The output unit 2030 may output information processed by the electronic device 2000 in an audio or video format, and the memory 2040 may store a program for processing and controlling of the processor 2050, or data. The processor 2050 may send an instruction to the memory 2040 depending on a required action to store or retrieve data.

The memory 2040 may be embedded in the electronic device 2000, or may communicate with the processor 2050 through a separate interface. When the memory 2040 communicates with the processor 2050 through the separate interface, the processor 2050 may store or retrieve data from the memory 2040 through various interface standards, such as secure digital (SD), secure digital high capacity (SDHC), secure digital extended capacity (SDXC), Micro SD, or universal serial bus (USB).

The processor 2050 may control operation of each component included in the electronic device 2000. The processor 2050 may perform controlling and processing associated with a voice call, a video call, and data communications, or carry out controlling and processing for multimedia reproduction and management. The processor 2050 may process an input entered by a user through the input unit 2020 and output a result through the output unit 2030. The processor 2050 may store or retrieve data controlling operations of the electronic device 2000 from the memory 2040. At least one of the processor 2050 and the memory 2040 may include a semiconductor device according to various exemplary embodiments of the present inventive concept.

Figure 17:
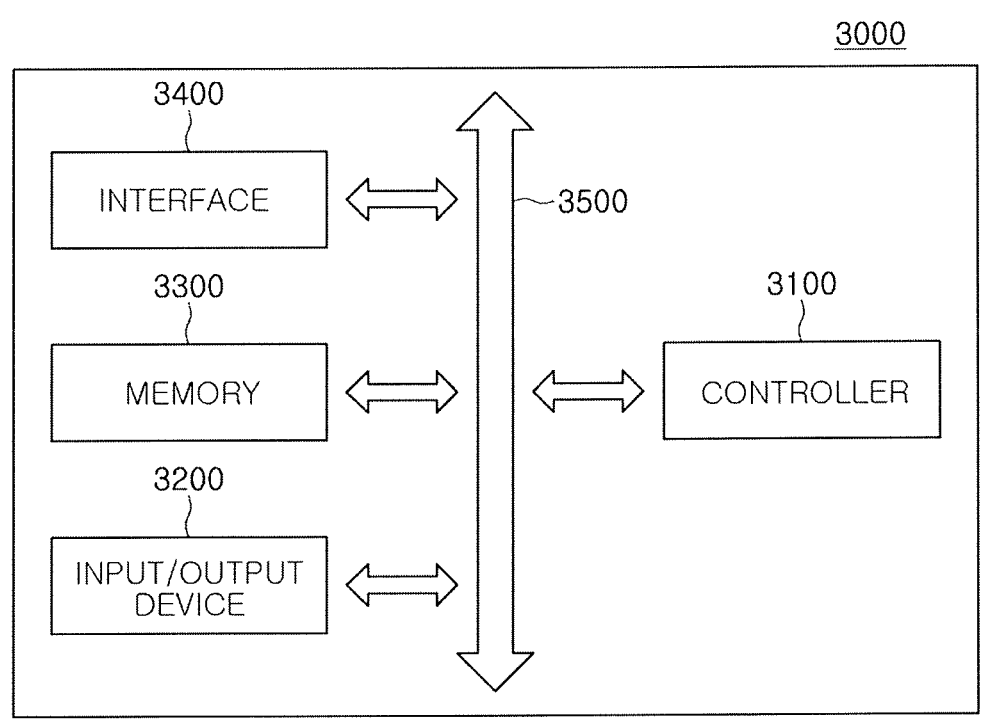
FIG. 17 is a schematic diagram of a system including a semiconductor device according to an exemplary embodiment of the present inventive concept.

FIG. 17 is a schematic diagram of a system including a semiconductor device according to an exemplary embodiment of the present inventive concept.

Referring to FIG. 17, a system 3000 may include a controller 3100, an Input/Output (I/O) device 3200, a memory 3300, and an interface 3400. The system 3000 may be a mobile system, or a system that transmits or receives information. The mobile system may be a personal digital assistant (PDA), a portable computer, a tablet PC, a wireless phone, a mobile phone, a digital music player, or a memory card.

The controller 3100 may execute a program and control the system 3000. The controller 3100 may be, for example, a microprocessor, a digital signal processor, or a microcontroller.

The I/O device 3200 may be used to input or output data of the system 3000. The system 3000 may use the I/O device 3200 to be connected to an external device, such as, a personal computer or a network, communicating data with the external device. The I/O device 3200 may be, for example, a keypad, a keyboard, or a display.

The memory 3300 may store a code and/or data for operation of the controller 3100 and/or store data processed by the controller 3100. The memory 3300 may include a semiconductor device according to an exemplary embodiment of the present inventive concept.

The interface 3400 may be a data transfer path between the system 3000 and other external devices. The controller 3100, the I/O device 3200, the memory 3300, and the interface 3400 may communicate with each other through a bus 3500.

At least one of the controller 3100 and the memory 3300 may include a semiconductor device according to various exemplary embodiments of the present inventive concept.

According to exemplary embodiments of the present inventive concept, inclusion of a source contact and a body contact using the channel hole having substantially the same shape as the memory cell string may allow the semiconductor device with an increased degree of integration to be provided.

While the present inventive concept has been particularly shown and described with reference to exemplary embodiments thereof, it will be understood that various changes in form and details may be made therein without departing from the spirit and scope of the present inventive concept.

What is claimed is:

1. A semiconductor device comprising:
a gate stack including gate electrodes stacked vertically on a substrate;
channel holes penetrating through the gate stack to extend vertically to the substrate, wherein the channel holes include a pair of first channel holes and at least one second channel hole between the pair of first channel holes, wherein each of the channel holes includes a channel region, and wherein the gate electrodes share the pair of first channel holes and the at least one second channel hole;
a single horizontal portion disposed below the gate stack, connecting lower portions of the pair of first channel holes and the at least one second hole, and extending horizontally;
first channel pads, the pair of first channel holes opposite the substrate;
at least one second channel pads disposed at an end of the at least one second channel hole opposite the substrate,
wherein portions of the channel region extend from the channel holes to the single horizontal portion to be connected to each other;
first interconnection lines connected to the first channel pads; and
at least one second interconnection line connected to the at least one second channel pads, wherein the at least one second interconnection line receives an electrical signal different from an electrical signal applied to the first interconnection lines.

2. The semiconductor device of claim 1, wherein the first and second interconnection lines are disposed at different heights.

3. The semiconductor device of claim 1, wherein the single horizontal portion has a plate shape extending in a direction along the gate electrodes.

4. The semiconductor device of claim 1, further comprising insulation layers disposed on both sides of the gate stack, and extending in a direction along the gate stack.

5. The semiconductor device of claim 1, wherein the gate electrodes comprise a single gate electrode, and
wherein the pair of first channel holes and the at least one second channel hole penetrate through the single gate electrode.

6. A semiconductor device, comprising:
a gate stack including gate electrodes stacked vertically on a substrate;
channel holes penetrating through the gate stack to extend vertically to the substrate, wherein the channel holes include a pair of first channel holes and at least one second channel hole between the pair of first channel holes, wherein each of the channel holes includes a channel region, and wherein the gate electrodes share the pair of first channel holes and the at least one second channel hole;
a single horizontal portion disposed below the gate stack, connecting lower portions of the pair of first channel holes and the at least one second hole, and extending horizontally;
first channel pads, the pair of first channel holes opposite the substrate;
at least one second channel pads disposed at an end of the at least one second channel hole opposite the substrate,
wherein portions of the channel region extend from the channel holes to the single horizontal portion to be connected to each other; and
a hole connecting portion disposed on sides of two adjacent channel holes of the channel holes to connect the two adjacent channel holes to each other.

7. The semiconductor device of claim 6, wherein the first and second channel pads are disposed at upper ends of the channel holes connected by the hole connecting portion.

8. The semiconductor device of claim 6, wherein the hole connecting portion extends horizontally above an upper surface of the substrate between the channel holes.

9. A semiconductor device of claim 1, comprising:
a gate stack including gate electrodes stacked vertically on a substrate;
channel holes penetrating through the gate stack to extend vertically to the substrate, wherein the channel holes include a pair of first channel holes and at least one second channel hole between the pair of first channel holes, wherein each of the channel holes includes a channel region, and wherein the gate electrodes share the pair of first channel holes and the at least one second channel hole;
a single horizontal portion disposed below the gate stack, connecting lower portions of the pair of first channel holes and the at least one second hole, and extending horizontally;
first channel pads, the pair of first channel holes opposite the substrate; and
at least one second channel pads disposed at an end of the at least one second channel hole opposite the substrate, wherein portions of the channel region extend from the channel holes to the single horizontal portion to be connected to each other, wherein each of the first channel pads includes at least one first conductivity-type impurity, and wherein each of the second channel pads includes at least one second conductivity-type impurity.

* * * * *

UNITED STATES PATENT AND TRADEMARK OFFICE
CERTIFICATE OF CORRECTION

PATENT NO. : 9,853,045 B2  
APPLICATION NO. : 15/173888  
DATED : December 26, 2017  
INVENTOR(S) : Sung Min Hwang et al.

Page 1 of 1

It is certified that error appears in the above-identified patent and that said Letters Patent is hereby corrected as shown below:

In the Claims

In Claim 9, Line 49, "of claim 1" should be deleted.

Signed and Sealed this  
Fifth Day of October, 2021

Drew Hirshfeld  
*Performing the Functions and Duties of the*  
*Under Secretary of Commerce for Intellectual Property and*  
*Director of the United States Patent and Trademark Office*